United States Patent
Sharma

(10) Patent No.: US 11,125,845 B2
(45) Date of Patent: Sep. 21, 2021

(54) APPARATUS AND METHOD FOR DEEP LEARNING TO MITIGATE ARTIFACTS ARISING IN SIMULTANEOUS MULTI SLICE (SMS) MAGNETIC RESONANCE IMAGING (MRI)

(71) Applicant: CANON MEDICAL SYSTEMS CORPORATION, Otawara (JP)

(72) Inventor: Anuj Sharma, Vernon Hills, IL (US)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 224 days.

(21) Appl. No.: 16/362,397

(22) Filed: Mar. 22, 2019

(65) Prior Publication Data

US 2020/0300954 A1   Sep. 24, 2020

(51) Int. Cl.
*G01R 33/561* (2006.01)
*G01R 33/565* (2006.01)
(Continued)

(52) U.S. Cl.
CPC ........ *G01R 33/5611* (2013.01); *G01R 33/565* (2013.01); *G06N 3/0454* (2013.01); *G06N 3/084* (2013.01); *G06N 20/20* (2019.01)

(58) Field of Classification Search
CPC .............. G01R 33/5611; G01R 33/565; G01R 33/5608; G01R 33/4824; G01R 33/561; G01R 33/4835; G01R 33/4818; G06N 3/0454; G06N 20/20; G06N 3/084; G06N 3/08; G06T 2207/10088; G06T 2207/20081; G06T 2207/20084
See application file for complete search history.

(56) References Cited

U.S. PATENT DOCUMENTS 7,375,523 B1 * 5/2008 Hancu .................... G01R 33/10
324/307
10,635,943 B1 * 4/2020 Lebel ........................ G06T 5/50
(Continued)

FOREIGN PATENT DOCUMENTS

KR          10-1923184 B1    11/2018
WO    WO 2016/018073 A1    2/2016

OTHER PUBLICATIONS

Nikolai J. Mickevicius et al., Application of a k-Space Interpolating Artificial Neural Network to In-Plane Accelerated Simultaneous Multislice Imaging, arXiv: 1902.08589 [physics.med-ph], Feb. 22, 2019 (Year: 2019).*

(Continued)

*Primary Examiner* — Daniel R Miller
(74) *Attorney, Agent, or Firm* — Oblon, McClelland, Maier & Neustadt, L.L.P.

(57) ABSTRACT

A deep learning (DL) network is proposed to mitigate artifacts in simultaneous multi-slice (SMS) magnetic resonance imaging (MRI) data. For example, unaliased images generated from SMS aliased images can exhibit leakage artifacts due to inaccuracies in the receive-coil sensitives used during sensitivity encoding (SENSE) processing. To mitigate leakage artifacts, the DL network learns to correct the receive-coil sensitives before SENSE processing, and/or learns to detect and subtract the artifacts from the unaliased images after SENSE processing. The DL network can also be trained to denoise the unaliased images.

18 Claims, 13 Drawing Sheets

(51) Int. Cl.
  *G06N 20/20* (2019.01)
  *G06N 3/04* (2006.01)
  *G06N 3/08* (2006.01)

(56) References Cited

U.S. PATENT DOCUMENTS

| | | |
|---|---|---|
| 2007/0007960 A1 | 1/2007 | King et al. |
| 2013/0181710 A1 | 7/2013 | Setsompop et al. |
| 2016/0299207 A1 | 10/2016 | Guidon |
| 2019/0236817 A1* | 8/2019 | Cheng ............... G06N 3/0454 |
| 2020/0020082 A1* | 1/2020 | Zahneisen ............... G06N 3/04 |
| 2020/0027251 A1* | 1/2020 | Demesmaeker ...... G06T 11/006 |

OTHER PUBLICATIONS

C. Zhang, S. Moeller, S. Weingärtner, K. Uğurbil and M. Akçakaya, "Accelerated Simultaneous Multi-Slice MRI using Subject-Specific Convolutional Neural Networks," 2018 52nd Asilomar Conference on Signals, Systems, and Computers, Pacific Grove, CA, USA, 2018 (Year: 2018).*

Chen Quin, et al. "Convolutional Recurrent Neural Networks for Dynamic MR Image Reconstruction", IEEE.

David J. Larkman, et al. "Use of Multicoil Arrays for Separation of Signal from Multiple Slices Simultaneously Excited", Journal of Magnetic Resonance Imaging 13:313-317 (2001).

Kawin Setsompop, et al. "Blipped-Controlled Aliasing in Parallel Imaging for Simultaneous Multislice Echo Planar Imaging With Reduced g-Factor Penalty", Magnetic Resonance in Medicine 67:1210-1224 (2012).

Markus Barth, et al. "Simultaneous Multislice (SMS) Imaging Techniques", Magnetic Resonance in Medicine 00:00-00 (2015).

Stephen F. Cauley, et al. "Interslice Leakage Artifact Reduction Technique for Simultaneous Multislice Acquisitions", Magnetic Resonance in Medicine 72:93-102 (2014).

Suhyung Park, et al. "Simultaneous Multislice Aliasing Separation Exploiting Hankel Subspace Learning", Magnetic Resonance in Medicine 00:00-00(2016).

* cited by examiner

APPARATUS AND METHOD FOR DEEP LEARNING TO MITIGATE ARTIFACTS ARISING IN SIMULTANEOUS MULTI SLICE (SMS) MAGNETIC RESONANCE IMAGING (MRI)

FIELD

This disclosure relates to using deep learning (DL) networks in simultaneous multi-slice (SMS) magnetic resonance imaging (MRI), and, more particularly, to using DL to reduce artifacts arising from discrepancies between estimated and actual coil sensitivities in sensitivity encoding (SENSE) methods of reconstructing slice images from SMS data.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Single-shot two-dimensional (2D) echo-planar imaging (EN) acquisition methods that acquire the entire k-space signal in one shot are widely used in MR applications such as diffusion-weighted imaging (DWI) and functional magnetic resonance imaging (fMRI). Though EPI is a fast imaging method, DWI and DM still suffer from long scan durations due to the need to acquire multiple images along different diffusion-encoding directions in DWI and the high temporal resolution needed in MARI. In imaging methods where the signal is acquired using multiple repetitions, several techniques for acceleration can be used to reduce the long pulse repetition time (TR) associated with high-resolution full coverage imaging. For example, accelerated 2D parallel imaging techniques such as SENSE can be used to reduce phase encoding steps during an acquisition. However, in EPI SENSE does not significantly reduce the scan duration because all the phase encode lines are acquired in a single shot. SENSE, is primarily used in EPI to increase the phase encode bandwidth which in turn reduces artifacts such as image distortion and T2 blurring.

In contrast, simultaneous multi-slice (SMS) techniques can significantly reduce the time required to acquire a fixed number of slices EPI. This is accomplished through imaging multiple slices during a shared readout time. When the k-space lines are fully sampled, the simultaneously acquired slices do not exhibit typical $\sqrt{R}$ reductions in signal-to-noise ratio (SNR) observed with parallel imaging acceleration techniques. SMS techniques can be used with wideband imaging, simultaneous echo refocusing (SER), and parallel image reconstruction. Parallel imaging methods that incorporate SER can also be introduced fir fMRI and diffusion applications. SMS is a promising parallel imaging modality that works well when the simultaneously acquired slices have substantial distance between them.

However, for imaging with a smaller coverage range along the slice direction, the smaller slice gap makes the simultaneously acquired slices more difficult to separate. Controlled aliasing (CAIN) techniques can be introduced to perform shifts across the slices to more easily unalias the accelerated data. This method applies phase-shifted radiofrequency pulses for excitation of each k-space line, making it incompatible with echo-planar imaging. Other approaches based on the wideband method can be compatible with echo-planar imaging and create CAIPI-like effects between excited slices, but are susceptible to undesirably large voxel tilting artifacts. A blipped-CAIPI approach can be used to achieve spatial shifts, in the PE direction, between simultaneously excited slices. Accordingly, the blipped-CAIN approach avoids voxel tilting artifacts and enables SMS acquisitions with high acceleration factors with a low g-factor penalty; allowing for significant gains in the temporal efficiency of diffusion imaging and fMRI acquisitions.

Other methods use k-space-based methods for the reconstruction of CAIPI acquisitions. These other methods include SENSE/GRAPPA, slice-GRAPPA (SG) (14), and Auto-calibrating CAIPI.

Parallel MRI can be used in clinical applications to either reduce scan time or increase spatial and temporal resolution without increasing the scan time. Using a k-space with a sub-Nyquist sampling rate yields incomplete data, which results in aliasing artifacts without specialized reconstruction. To obtain aliasing-free images, missing signals can be reconstructed by utilizing spatial sensitivity encoding with an array of multiple receiver surface coils. Parallel MRI reconstruction is in general classified into SENSE (sensitivity encoding)- and GRAPPA (generalized auto-calibrating partially parallel acquisition)-based methods. In the SENSE-based methods, coil sensitivity is explicitly estimated and then employed to unfold images directly in the image domain. However, accurate estimates of the coil sensitivity are difficult to obtain, and even small errors may result in undesirable image artifacts, including inter-slice leakage artifacts and/or residual aliasing artifacts.

Accordingly, improved methods are desired to avoid/mitigate inter-slice leakage artifacts and/or residual aliasing artifacts in combination with the acceleration and advantageous SNR achieved using SMS with SENSE.

BRIEF DESCRIPTION OF THE DRAWINGS

A more complete understanding of this disclosure is provided by reference to the following detailed description when considered in connection with the accompanying drawings, wherein.

DETAILED DESCRIPTION

Figure 1A:
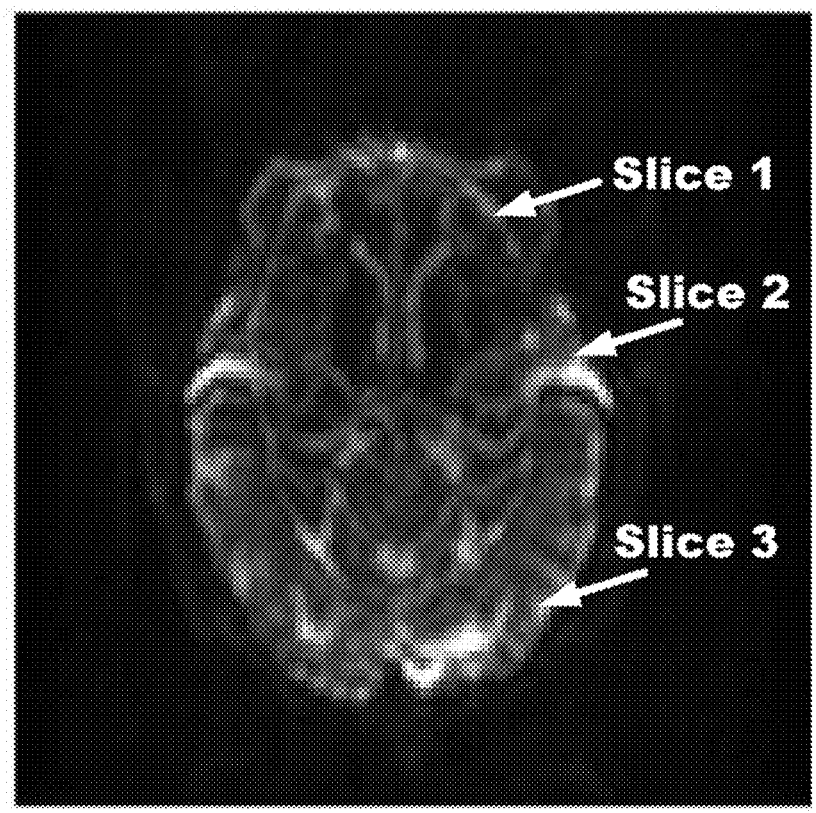
FIG. 1A shows an SMS image with three slices superimposed and overlapping each other, according to one implementation.

Exemplary embodiments are illustrated in the referenced figures of the drawings. It is intended that the embodiments and figures disclosed herein are to be considered illustrative rather than restrictive. No limitation on the scope of the technology and of the claims that follow is to be imputed to the examples shown in the drawings and discussed herein.

The embodiments are mainly described in terms of particular processes and systems provided in particular implementations. However, the processes and systems will operate effectively in other implementations. Phrases such as 'an implementation', 'an embodiment', 'one embodiment', and 'another embodiment' can refer to the same or different embodiments. The embodiments/implementations will be described with respect to methods and compositions having certain components. However, the methods and compositions can include more or less components than those shown, and variations in the arrangement and type of the components can be made without departing from the scope of the present disclosure.

The exemplary embodiments are described in the context of methods having certain steps. However, the methods and compositions operate effectively with additional steps and steps in different orders that are not inconsistent with the exemplary embodiments. Thus, the present disclosure is not intended to be limited to the embodiments shown, but is to be accorded the widest scope consistent with the principles and features described herein and as limited only by the appended claims.

Furthermore, where a range of values is provided, it is to be understood that each intervening value between an upper and lower limit of the range—and any other stated or intervening value in that stated range—is encompassed within the disclosure. Where the stated range includes upper and lower limits, ranges excluding either of those limits are also included. Unless expressly stated, the terms used herein are intended to have the plain and ordinary meaning as understood by those of ordinary skill in the art. Any definitions are intended to aid the reader in understanding the present disclosure, but are not intended to limit the meaning of such terms unless specifically indicated.

As discussed above, in sensitivity encoding (SENSE)-based methods, coil sensitivities for the receive coils in a magnetic resonance imaging (MRI) system are estimated and then used to unfold images directly in the image domain. However, accurate estimations of the coil sensitivity is difficult, and even small errors can result in undesirable image artifacts, including inter-slice leakage artifacts and/or residual aliasing artifacts. Accordingly, the methods described herein use deep learning (DL) to address inaccuracies in the estimated coil sensitivity and/or the artifacts arising therefrom. The methods described herein address these issues in one or more ways, including: (i) using a DL artificial neural network (ANN) trained to correct the estimated coil sensitivity, (ii) using a DL-ANN trained to better perform SENSE processing, and/or (iii) after the SENSE processing, using a DL-ANN trained to correct artifacts arising from errors in the estimated coil sensitivity. Thus, the methods described herein provide the acceleration and advantageous SNR of SMS with SENSE processing without inter-slice leakage artifacts and/or residual aliasing artifacts.

Simultaneous multi-slice (SMS) imaging is a technique used for accelerating MR scans. Many techniques are practiced in MR imaging to speed up the acquisition process. Quicker acquisition of MRI images leads to improved comfort for the imaging subject (e.g. patient), and more accurate images due to reduction of artifacts caused by patient movement.

In SMS, scan time reduction is achieved by simultaneously exciting multiple slices in an ROI, using multiband radio frequency (RF) pulses and acquiring data using a two-dimensional (2D) phase encoded readout. Whereas, in-plane parallel imaging, the signal-to-noise ratio (SNR) is reduced proportional to the square root of the acceleration factor R (i.e., the SNR is inversely proportional to $\sqrt{R}$), in SMS, the SNR is maintained at the non-accelerated level because the decrease of SNR by $\sqrt{R}$ is offset by an increase in the SNR by the square root of the multiband factor MB. That is, SNR~$\sqrt{MB}/\sqrt{R}$, such that when MB is equal to R, the SNR is maintained. This is a significant advantage of SMS.

Figure 1B:
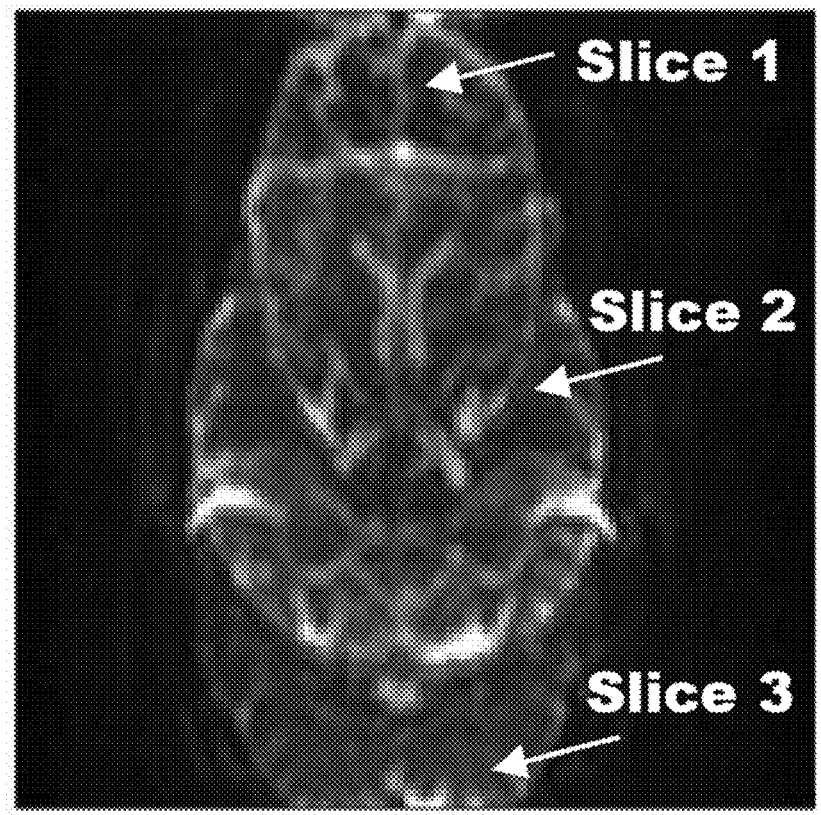
FIG. 1B shows a blipped-CAIPI SMS image with three slices superimposed and offset, with respect one another, in the phase-encoding direction, according to one implementation.

Referring now to the drawings, wherein like reference numerals designate identical or corresponding parts throughout the several views, FIGS. 1A and 1B show non-limiting examples of a standard SMS image and a blipped-CAIPI SMS image, respectively. In the accelerated SMS image shown in FIG. 1A, three slices, which are from different spatial depths/locations, overlap each other. In FIG. 1B, to improve SNR, the blipped-CAIPI technique is used to shift the slices with respect to each other in a phase encoding (PE) direction. This shift in the PE direction minimizes alias overlap, which reduces the g-factor penalty by utilizing the in-plane coil sensitivity variations. In SMS, including both standard and blipped-CAIPI techniques, slices are separated in reconstruction using parallel imaging techniques (e.g. SENSE). In SENSE, the receiver coil (Rx) sensitivity spatial profile (referred to as an Rx map) is used to resolve the individual slice images, as discussed in U.S. patent application Ser. No. 15/853,034 and Larkman et al., "Use of multicoil arrays for separation of signal from multiple slices simultaneously excited," J. of Mag. Res. Imaging, Vol 13, pp. 313-317 (2001), both of which are incorporated by reference in their entirety.

Example embodiments of the subject matter disclosed herein provide for determining and/or correcting inter-slice leakage artifacts in MR images generated from multi-slice imaging techniques such as, but not limited to, simultaneous multi-slice imaging (SMS), and, without loss of generality, in-plane accelerated imaging referred to as sensitivity encoding (SENSE) or a combination thereof. In simultaneous multi-slice MR image acquisition, signal contribution from one slice can be demultiplexed into output images of a plurality of slices. Unfortunately, inaccuracies in the calculated coil sensitivities (Rx maps) can result in artifacts in the respective single-slice (unaliased) images.

In addition to aliasing artifacts, both SMS and in-plane parallel imaging suffer SNR loss at high acceleration factors due to coil-geometry constraints. This reduction in SNR due to coil geometry is called the geometry-factor penalty or more commonly as the g-factor penalty. The g-factor can be thought of as a noise-amplification factor. For a given receive coil setup, higher noise can be expected in regions of the reconstructed image with high g-factor map values.

To better understand how the blipped-CAIPI technique improves the g-factor, it is helpful to consider that different slices can overlap each other. When there is not sufficient variation in receive coil sensitivity between the simultaneously acquired slices, it can become challenging to separate the signals from different slices. Thus, the SNR of the reconstructed slice images will be low due to the increased g-factor penalty. The SNR can be improved by shifting the slices with respect to each other in the phase encode (PE) direction at the time of acquisition using a method such as the blipped-CAIPI technique. The blipped-CAIPI technique exploits the in-plane variation of sensitivity in conventional receive coils designed for in-plane acceleration. The PE shift causes voxels in one slice to alias with voxels in one or more other slices that have sufficiently orthogonal receive sensitivity values. This reduces the relatively high g-factor penalty associated with un-aliasing simultaneously acquired closely spaced slices.

The simultaneously acquired slices are separated in reconstruction using parallel imaging techniques such as, but not limited to, SENSE. SENSE is a technique performed in the image domain after data from individual coils is Fourier transformed to the image space. In SMS, the SENSE un-aliasing matrix is set up using pre-determined receive coil sensitivity data from the acquired slice locations. Matrix algebra operations are utilized to obtain the unaliased single-slice image voxel intensity values by multiplying the un-aliasing matrix with the vector of acquired aliased image voxel intensity values from each receive coil. The PE shifts can be included in the reconstruction by shifting the receive coil sensitivity maps. In essence, the concept of conventional SENSE is extended in the slice direction to reconstruct SMS images.

For example, the output unaliased images are obtained by multiplying the acquired aliased image with the inverse of the SENSE coil sensitivity matrix. The SMS image acquisition and encoding process may be analytically represented as follows:

$$I = Cm$$

wherein I is the vector of acquired accelerated image intensity values from all receive coils, C is the SENSE aliasing matrix, m is the vector of unaliased image intensity values from all spatial locations that have aliased to form I. The above equation can be written in the full matrix-vector form as:

$$\begin{bmatrix} I_1(x,y) \\ I_2(x,y) \\ \vdots \\ I_{NC}(x,y) \end{bmatrix} = \begin{bmatrix} C_{11}(x,y-y_1) & C_{12}(x,y-y_2) & \cdots & C_{1Ns}(x,y-y_{Ns}) \\ C_{21}(x,y-y_1) & C_{22}(x,y-y_2) & \cdots & C_{2Ns}(x,y-y_{Ns}) \\ \vdots & \vdots & \ddots & \vdots \\ C_{NC1}(x,y-y_1) & C_{NC2}(x,y-y_2) & \cdots & C_{NcNs}(x,y-y_{Ns}) \end{bmatrix}$$

$$\begin{bmatrix} m_1(x,y-y_1) \\ m_2(x,y-y_2) \\ \vdots \\ m_{Ns}(x,y-y_{2Ns}) \end{bmatrix}$$

wherein Nc represents the number of coils indexed by i, Ns represents the number of slices indexed by j, $I_i$ represents the image acquired by coil i, $C_{ij}$ represents receive sensitivity of coil i for slice j, $m_j$ represents the unaliased image intensity of slice j, x and y are spatial location indices and $y_j$ represents the slice shift ($y_j=0$ for all j when slices are not shifted).

The vector of unaliased image intensity values can be reconstructed by analytically solving the above equation to get $$m = (C^\dagger + C + \lambda \Gamma)^{-1} C^\dagger I$$

wherein $\lambda$ is the weight of Tikhonov regularizer (which is optional), $\Gamma$ is the identity matrix, and † is the Hermitian transpose operator.

In certain implementations, an analytic solution may not be possible, e.g., when nonlinear k-space trajectories are used to acquire accelerated MR data. Accordingly, an iterative solver can be used to solve the above SENSE equation. For example, an iterative solver can start with an initial guess of the unaliased image intensity values and iteratively solve the SENSE equation to converge to a clean unaliased image.

Conceptually, the SENSE reconstruction operates as a band separator on multiband MR images. It takes in a multiband image and separates it into single-band images. That is, SENSE takes as input a single multiband image generated based on the MR signals received at the receive coils from a plurality of the excited slices, and, using coil sensitivity maps, determines and/or generates a coil-combined image for each of the excited slices from which MR signals were received.

Figure 2:
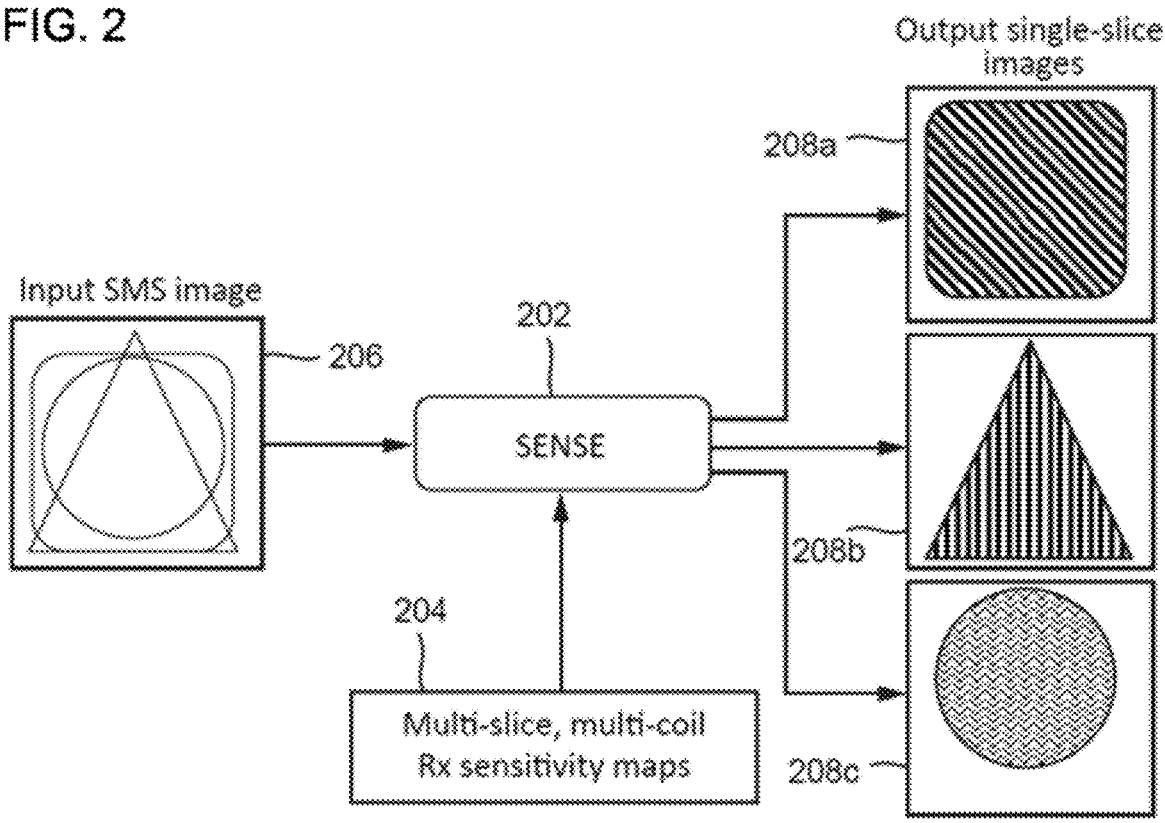
FIG. 2 shows a schematic diagram in which a sensitivity encoding (SENSE) operation separates slices in an SMS image, according to one implementation.

SENSE can be used to reconstruct single slice images from multiband images generated from parallel imaging techniques, such as, SMS and in-plane parallel imaging. FIG. 2 schematically illustrates the operation of an example SENSE reconstruction module 202, which results in an ideal output. The SENSE module 202 is provided with access to multi-slice, multi-coil receive sensitivity maps 204 for a volume including the ROI. An SMS image 206, acquired by simultaneously exciting three slices in the ROI, is input to the SENSE module 202. The input image 206 is a SMS 3X (i.e., acquired with SMS multiband factor of 3) multiband image. The input comprises multiband images obtained from all the receive channels of a phased array coil. For clarity of illustration, FIG. 2 shows only one input image. The SENSE module 202, outputs a respective coil-combined image (i.e., outputs 208a, 208b, and 208c) for each of the three slices in the input image 206. As illustrated, whereas the input image was a composite of the images of slices 1-3, the output images include a separate image for each slice. In the ideal operation, as illustrated in FIG. 2, each slice image contains an image reconstructed only from MR signals emitted by that slice. Thus, in the ideal operation scenario illustrated in FIG. 2, whereas the input image 206 is a composite of a rectangle, triangle and a circle, contributed by respective slices in the ROI, the output images 208a, 208b, and 208c each comprises only one of the rectangle, triangle or circle.

Figure 3:
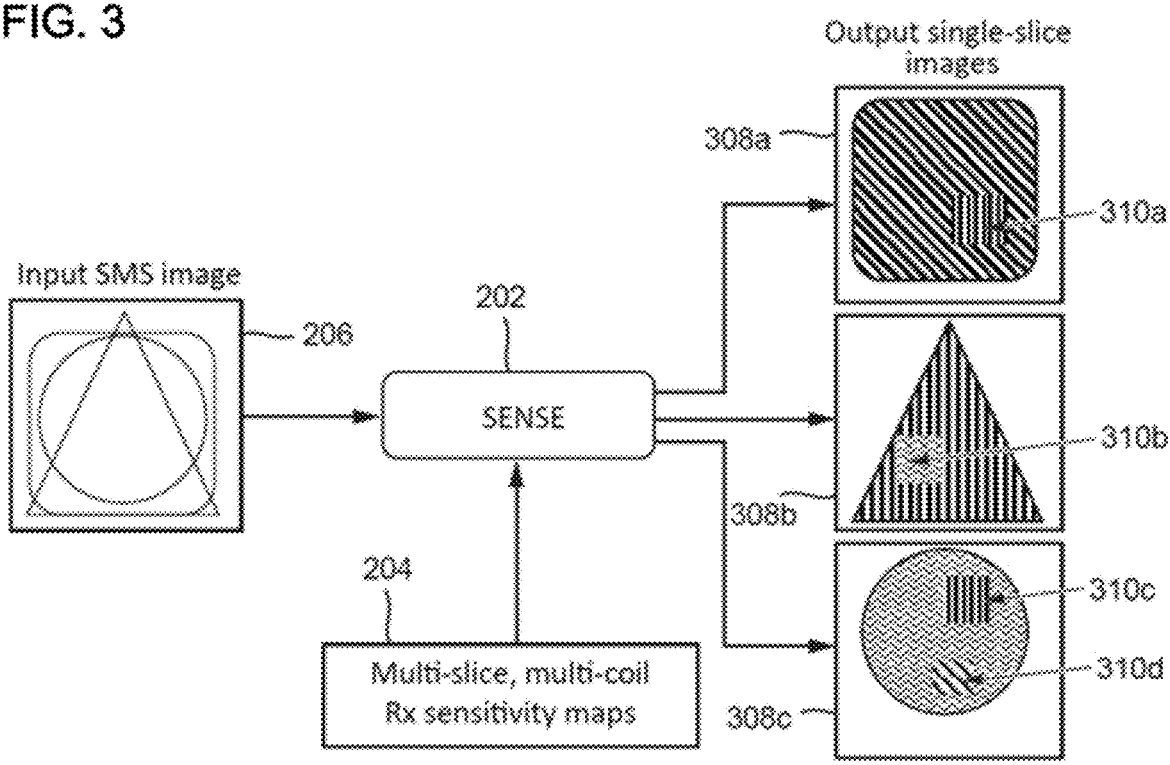
FIG. 3 shows that, as a practical matter, the schematic diagram using SENSE operation to separate slices in an SMS image can result in leakage/aliasing artifacts between the slices.

Whereas FIG. 2 schematically illustrates an ideal output scenario of the SENSE reconstruction module 202, FIG. 3 schematically illustrates what often occurs in practice when SENSE 202 is used on input images such as input image 206. Output images 308a, 308b, and 308c each include, in addition to the respective shape (rectangle, triangle and circle) that represents the image corresponding to MR signals received from a particular slice, an artifact (e.g., artifacts 310a, 310b, 310c, and 310d) that is caused by MR signal leakage from a different slice. As shown, the artifact 310a in the rectangle image (308a) is due to signal leakage from the triangle image (308b), artifact 310b in the triangle image (308b) is due to signal leakage from the circle image (308c), and artifacts 310c and 310d in the circle image (308c) are signal leakage from the triangle image (308b) and rectangle images (308a), respectively.

The non-ideal SENSE reconstruction is due, at least in part, to inaccuracies of coil sensitivity maps that are provided to the SENSE module 202. The inaccuracies lead to slice leakage artifacts which are image intensities from one slice showing up in another slice.

Figure 4:
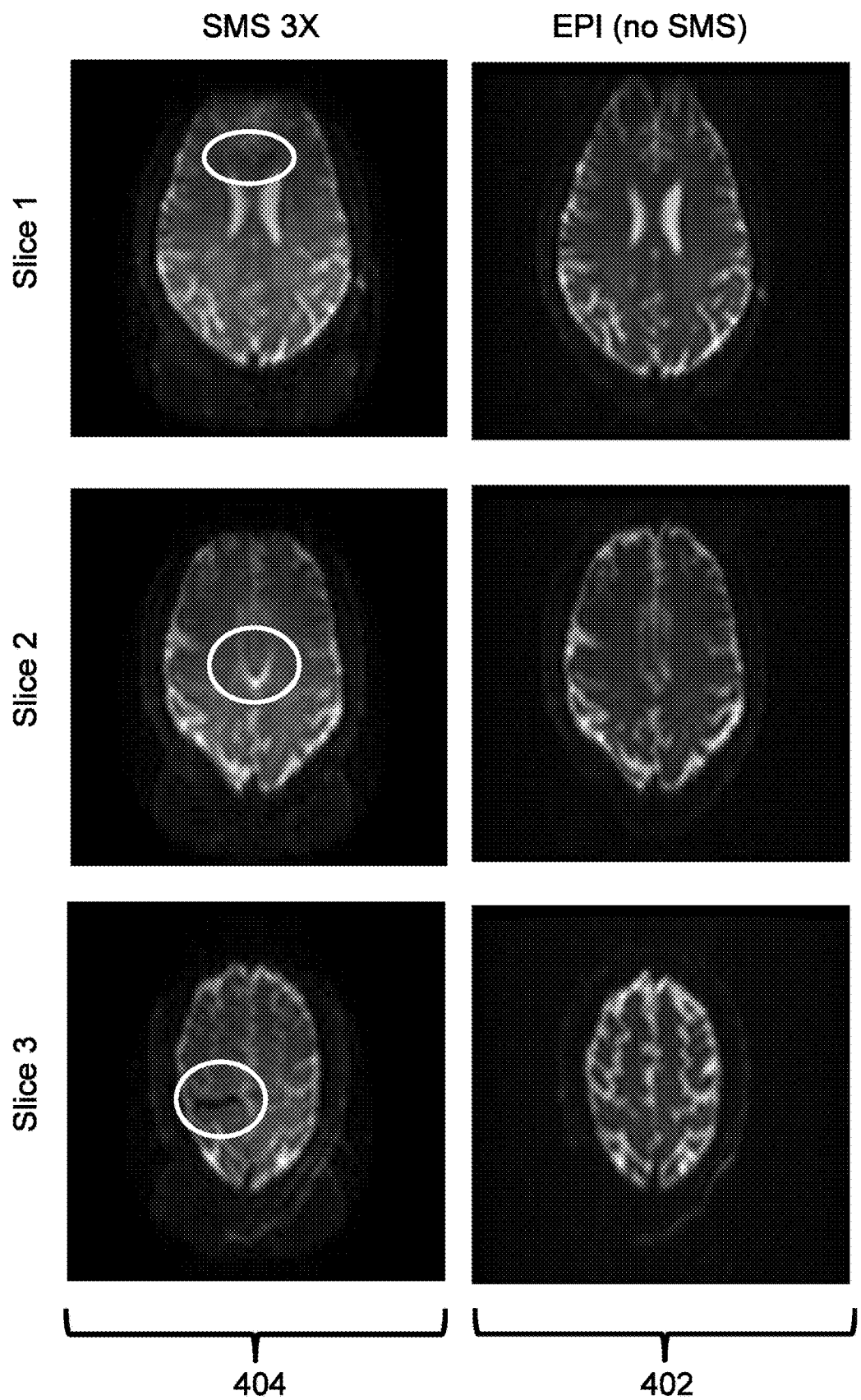
FIG. 4 shows an example of the leakage/aliasing artifacts between the slices from an SMS image by contrasting the unaliased SMS images (SMS 3X) with echo-planner imaging (EPI) images, which do not exhibit leakage/aliasing artifacts.

Leakage artifacts can appear as incoherent, sharp edges that are highly localized and asymmetric. FIG. 4 shows example slice leakage artifacts in images 404 acquired using SMS processing with an MB factor of 3 (3×) as compared to multi-slice Echo Planar Imaging (EPI) (images 402). Inter-slice leakage artifacts can be difficult to detect in an MR image, than many other types of artifacts. At least part of the reason for this disparity in the level of difficulty in detecting is due to the highly localized appearance of inter-slice artifacts, in contrast to the relatively distributed appearance and regular patterns exhibited by other artifacts. As illustrated in FIG. 4, inter-slice leakage can be difficult to identify separately from pathologies. As illustrated in the areas within marked circles in FIG. 4, inter-slice leakage can lead to substantial artifacts in MR images. Leaked signal in SMS may be misread by a radiologist (or other user/operator who uses MR images) as lesion, stroke or other pathologic features.

When a combination of SMS and in-plane accelerated imaging is used, the SENSE unaliasing matrix is set up to unalias MR images acquired by a SMS MRI data acquisition sequence. The SENSE unaliasing matrix is set up for a total acceleration factor R which includes an SMS acceleration factor MB and an in-plane reduced field of view (FOV) acceleration factor P such that R=MB*P. The SENSE reconstruction 202 takes as inputs multi-slice multi-coil receive sensitivity maps 204 and the input SMS images 206. Any known technique can be used to generate the coil sensitivity maps. For example, in certain implementations, sensitivity maps can be generated for each and every receive coil for each and every slice in the ROI. Alternatively, in other implementations, coil sensitivity maps are generated for some but not all receive coils and/or all slices in the ROI. In certain implementations, the coil sensitivities can be generated using one or more methods discussed in Pruessmann K. P., et al., SENSE: Sensitivity encoding for fast MRI, Magnetic Resonance in Medicine, 42:952-962, (1999), incorporated herein by reference in its entirety.

After generating the coil sensitivity maps, SENSE unaliasing matrix can be generated for a plurality of slice locations.

As discussed above, although effective for SMS MRI processing, SENSE is limited by the accuracy with which the receiver coils sensitivity $C_{ij}$ can be determined. Errors in the coil sensitivity $C_{ij}$ result in slice-leakage artifacts. The DL methods described herein provide several advantages over related methods to mitigate slice-leakage artifacts. Examples of related methods include (i) split slice-GRAPPA, (ii) SMS with Hankel subspace learning (HSL), and (iii) leakage map estimation methods.

Slice-GRAPPA is k-space based method to reconstruct SMS images by exploiting the linear dependencies between neighbouring k-space signals across all coils. A GRAPPA kernel is trained on single slice calibration images. Then the GRAPPA kernel is applied on SMS k-space to generate k-space data for the separated slices. Accordingly, the slice-GRAPPA kernel behaves as a filter in that it only lets signal from the slice of interest to pass through. Split slice-GRAPPA extends the filter concept such that the stopbands of the filter are calculated to suppress signal from all the slices outside the slice of interest. This is achieved by training the split slice-GRAPPA kernel to minimize signal contribution from the other slices.

SMS-HSL extends the split slice-GRAPPA concept by casting the SMS reconstruction as a non-convex optimization problem with three terms, one of which is a data fidelity term. The data fidelity term comprises a direct magnitude prior between the reference data and the reconstructed single-slice imaging data (at the locations where a low-resolution reference data was acquired). The slice leakage is reduced by minimizing, in Hankel space, the $l_2$-norm between the acquired SMS data and the sum of all the calibration k-space data from slices other than the slice of interest. Further, the optimization problem includes a low-rank constraint, which is added on the reconstructed single-slice data in Hankel space.

In leakage map estimation methods, slice leakage maps are directly measured. Then, the measured leakage maps are used to make a fractional leakage matrix which can be directly used in the SENSE reconstruction to reduce slice leakage.

Compared to the above-noted related methods, the methods described herein have several advantages. First, the methods described herein do not require or depend on assumptions about the source of mismatch between the receive coil sensitivity (i.e., Rx maps) and the main image. The mismatch between the estimated and actual Rx maps could come from distortion differences, poor post-processing of Rx maps, or other sources. Second, using the methods described herein, there is no need to explicitly estimate distortion maps, for example, using measured off-resonance maps. Rather, in certain implementations, the DL-ANN learns the distortion-transform that translates the input Rx maps to distortion-matched Rx maps. Third, unlike some of the related methods, the leakage map does not have to be explicitly measured, which can be a difficult problem. Fourth, compared to iterative methods, after initial offline training of the DL-ANN, DL-ANN-based solutions can be computed more quickly. That is, once the network is trained, images can be quickly reconstructed using one forward pass of the DL-ANN, which can be computed much faster than iterative methods which can require many iterations before converging. Fifth, the DL-ANN can be trained to simultaneously perform image denoising, in addition to artifact-reduction.

The methods described herein achieve the above advantages, at least in part, by using machine learning to mitigate slice leakage in SMS. Given sufficient training data, a neural network can be trained, based on the underlying stochastic distribution causing the leakage artifact, to match and compensate for the relevant features of the Rx maps. For example, this can be achieved by distortion matching the Rx maps for the receive coils followed by a SENSE reconstruction. The network can be trained, e.g., using backpropagation in order to generate using SENSE images that match as close as possible to the target images (i.e., gold standard images that are generated without artifacts).

Alternatively, the method described herein can mitigate leakage artifacts by treating the leakage as an additive residue that can be directly removed from the unaliased images using a Residual Network (ResNet).

Figure 5A:
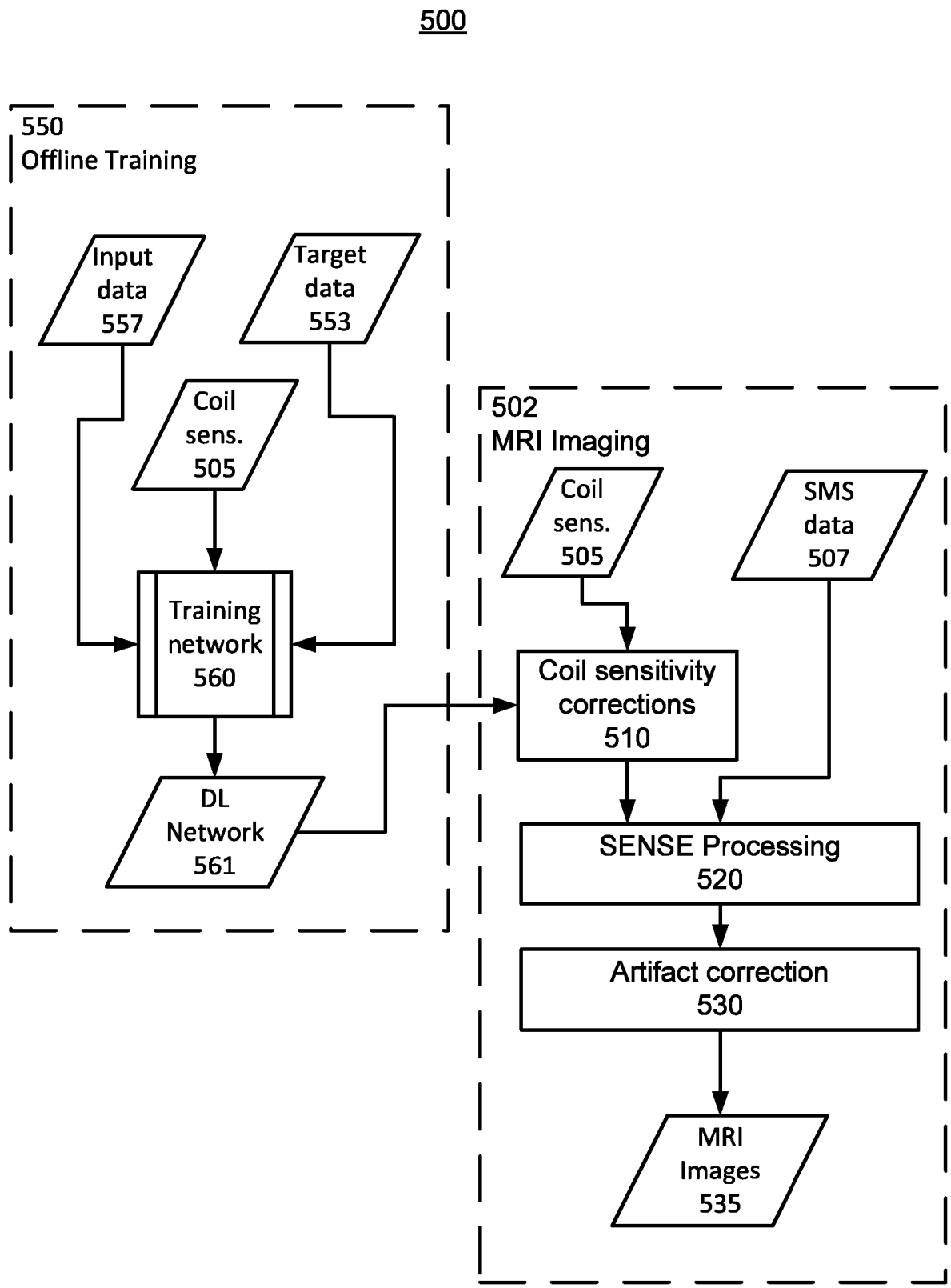
FIG. 5A shows an example of a flow diagram for training and using a deep learning (DL) artificial neural network (ANN) to mitigate leakage/aliasing artifacts by correcting receive coil (Rx) sensitivities (maps), which are used in a SENSE operation, according to one implementation.
Figure 5B:
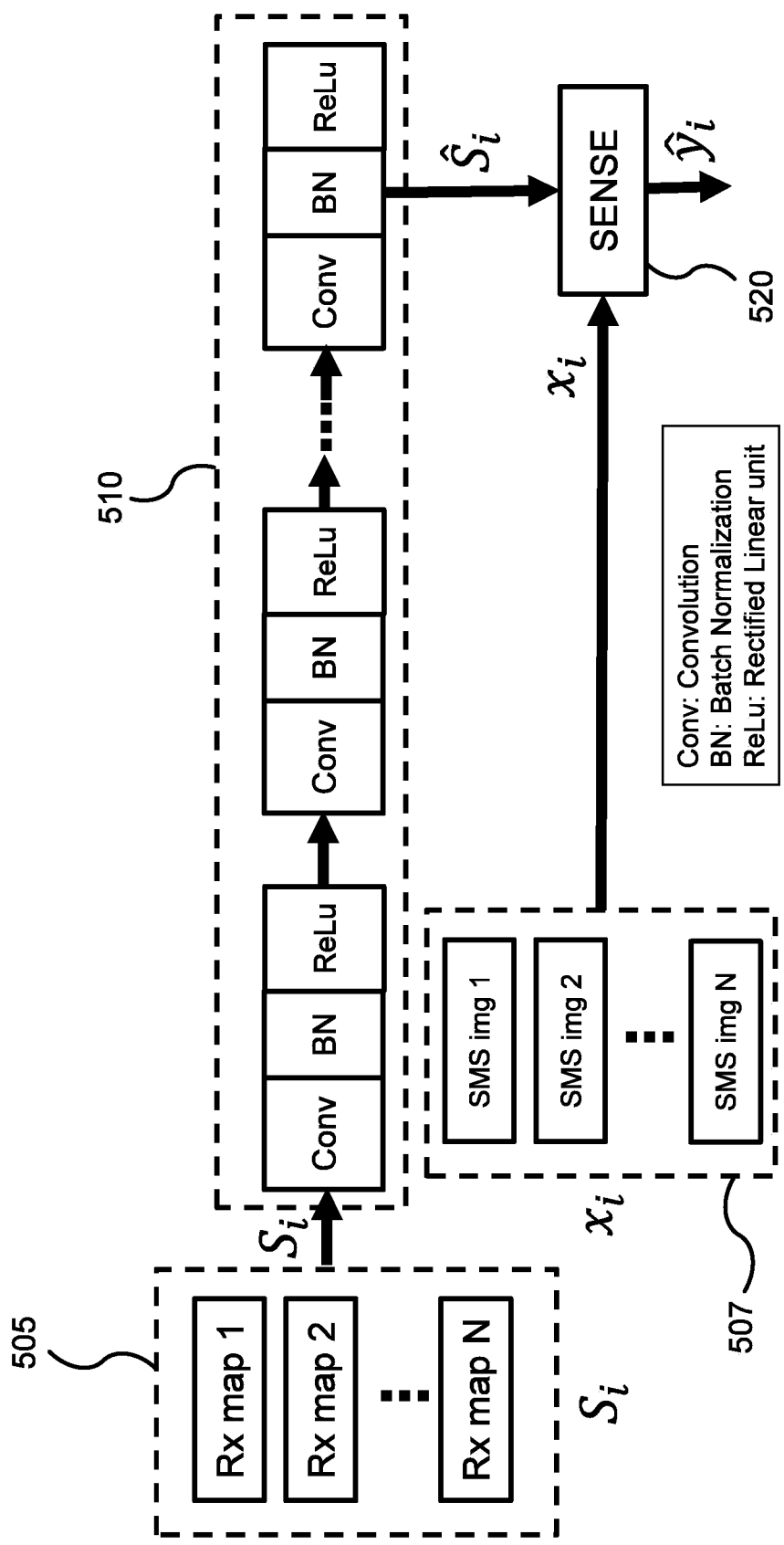
FIG. 5B shows a diagram for an example of data flow in an implementation of the flow diagram in FIG. 5A, according to one implementation.

FIGS. 5A and 5B show non-limiting examples of a method 500 that train and use a DL neural network 561 to aid in performing SMS MRI image reconstruction. Method 500, as illustrated in FIG. 5A, uses a DL-ANN (DL network 561) to learn how to correct errors in the original coil sensitivity 505 ($S_i$) to generate a corrected coil sensitivity ($\hat{S}_i$). Method 500 includes two parts: (i) an offline training process 550 and (ii) an MRI imaging process. Process 550 trains the DL ANN 561, and process 502 uses the trained network 561 to correct the coil sensitivity 505, ultimately generating high-quality MRI images 535 in which the artifacts have been mitigated.

FIG. 5B shows a non-limiting example of steps 510 and 520 in process 502. Similar steps are performed in process 560 to train the network 561. As discussed later, training the network 561 can be an iterative process in which input data from a training dataset is applied to the network 561 (similar to how the network 561 is to be used in step 510—and in some implementations step 520) and the result is compared to a desired output (i.e., target data from the training dataset) in an iterative process of adjusting the weighting coefficients of the network 561.

In FIG. 5B, the network 561 is shown as a convolutional neural network (CNN) in which series of convolution (conv), batch normalization (BN), and rectified linear unit (ReLu) network layers are performed. In step 510, the coil sensitivity 505 $S_i$ is applied to the network 561 to generate the corrected coil sensitivity $\hat{S}_i$, and this corrected coil sensitivity $\hat{S}_i$ is used, in step 520, to perform SENSE processing on the SMS data 507 ($x_i$). The coil sensitivity 505 $S_i$ includes, for each of N receive coils, a corresponding Rx map (designated in FIG. 5B as Rx map 1, Rx map 2, ..., Rx map N). The SMS data 507 are, e.g., unaliased SMS images.

The network 561 is trained using process 560. In process 550, a loss function is used to iteratively adjust/optimize parameters of the DL-ANN network 561 (e.g., the parameters of the DL-ANN network 561 can include weighting coefficients connecting network layers, and activation functions/potentials of nodes within the layers). The optimization of the network parameters continues until stopping criteria are satisfied (e.g., a stopping criterion can be whether the value of the loss function has converged to a predefined threshold) to generate the trained network 561.

The loss function compares target data 553 to an output acquired using the input data 557, the coil sensitivity 505 and current version of the DL-ANN network 561. For example, the output can be acquired by applying the current version of the DL-ANN network 561 to the coil sensitivity 505 to generate a corrected coil sensitivity $\hat{S}_i$, and then applying this corrected coil sensitivity $\hat{S}_i$ to perform SENSE processing to generate the output that is compared to the target data/images 553. The target data 553 can be single-slice, coil-combined images acquired without SMS ($y_i$), which consequently do not exhibit the leakage artifacts of the SMS slice images $\hat{y}_i$. The network 561 is trained when the difference between output and the target data is minimized, sufficient to satisfy one or more predetermined stopping criteria of process 560. The trained network 561 can then be stored and used later in the MRI imaging process 502.

In certain implementations, the loss function is given by $$J(w) = \sum_{i=1}^{M} \|y_i - \hat{y}_i\|_2^2$$

wherein w is a set of weights learned by the DL-ANN network 561, $\hat{y}_i = f(\hat{S}_i, x_i)$ in which $$f(\hat{S}_i, x_i) = \min_{\hat{y}_i} \|x_i - \hat{S}_i \hat{y}_i\|_2^2$$

represents the SENSE operation, and the corrected coil sensitivity $\hat{S}$ can be represented as $$\hat{S}_i = g(S_i, w)$$

in which g( ) represents the DL operation. According to this implementation, the network learns weights that distort the original Rx maps to match the actual coil sensitivities. These corrected Rx maps are then applied as an input into the SENSE equation along with the input aliased SMS images $x_i$, thereby producing images $\hat{y}_i$ that are similar to the single-slice images $y_i$, which are leakage-artifact free.

In certain implementations, a modified backpropagation method is used to train the network 361, wherein the gradient of the loss function is computed through the SENSE operation to perform the modified backpropagation method.

Because the target data does not include the artifacts commonly found in the SMS slice images $\hat{y}_i$ in which the coil sensitivity $\hat{S}$ includes errors, training the network 561 to produce images matching the target images $y_i$ will reduce the errors in the corrected coil sensitivity $\hat{S}$ generated using the network 561. The effect of the network 561 is to distortion match the Rx maps, such that, when the corrected coil sensitivity $\hat{S}_i$ is applied to the aliased SMS images $x_i$ using SENSE, the separated SMS slice images $\hat{y}_i$ are generated without leakage artifacts.

For best results, the network 561 is trained using a large dataset of training pairs. Each training pair will include a set of input images (e.g., aliased SMS images $x_i$ from the N coils), a corresponding set of target images (e.g., single-slice, coil-combined images acquired without SMS $y_i$) and the coil sensitivity maps $S_i$. The entire set of training data will include M training pairs, wherein M is preferably a large number.

In step 530 of process 502, artifact correction can be performed on the separated SMS slice images $\hat{y}_i$. Step 530 is optional, and is discussed later with reference to FIGS. 7A and 7B.

Figure 6A:
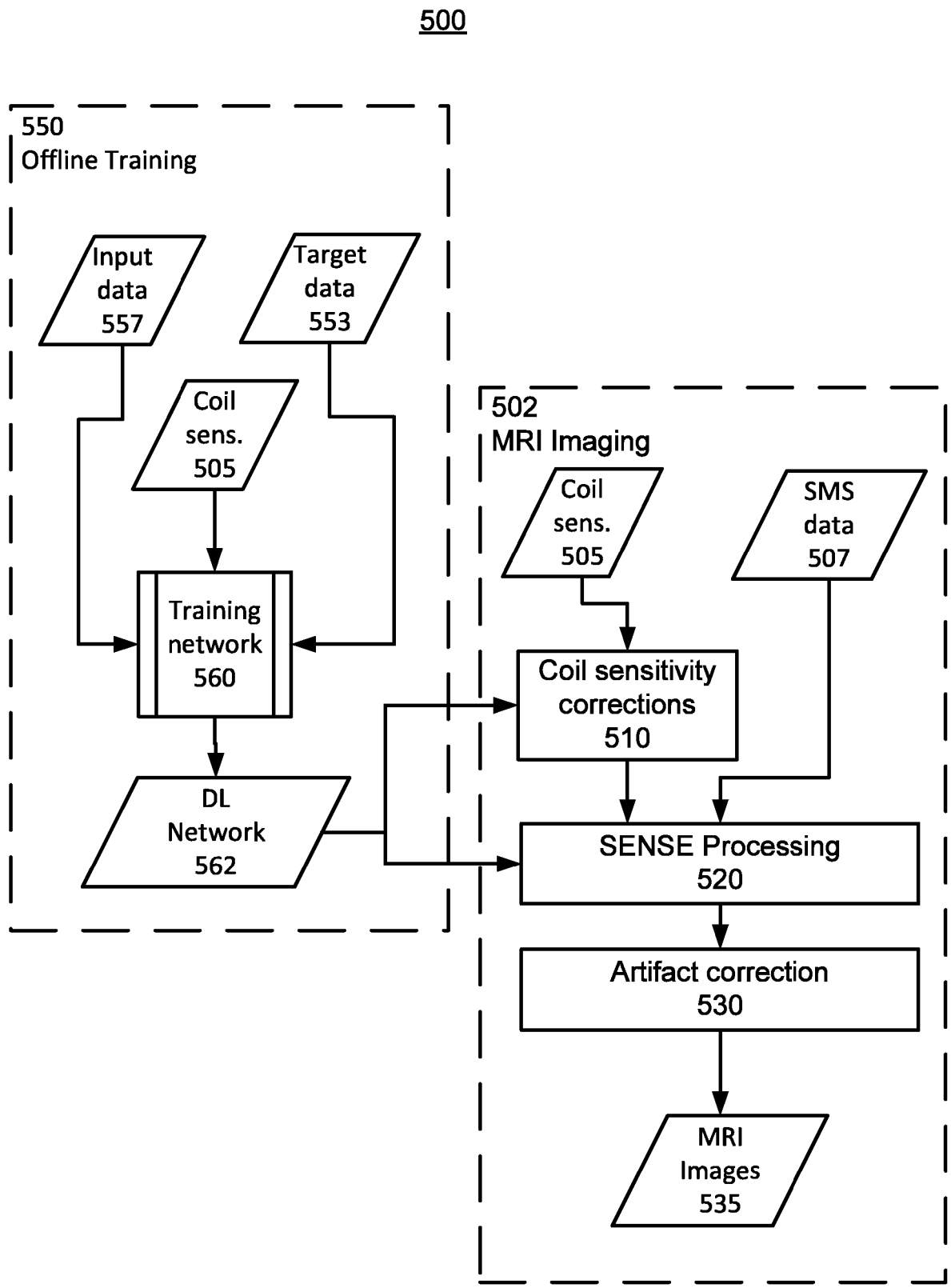
FIG. 6A shows an example of a flow diagram for training and using a DL-ANN to mitigate leakage/aliasing artifacts in which the correction of the Rx maps and the SENSE operation are both performed by the DL-ANN, according to one implementation.
Figure 6B:
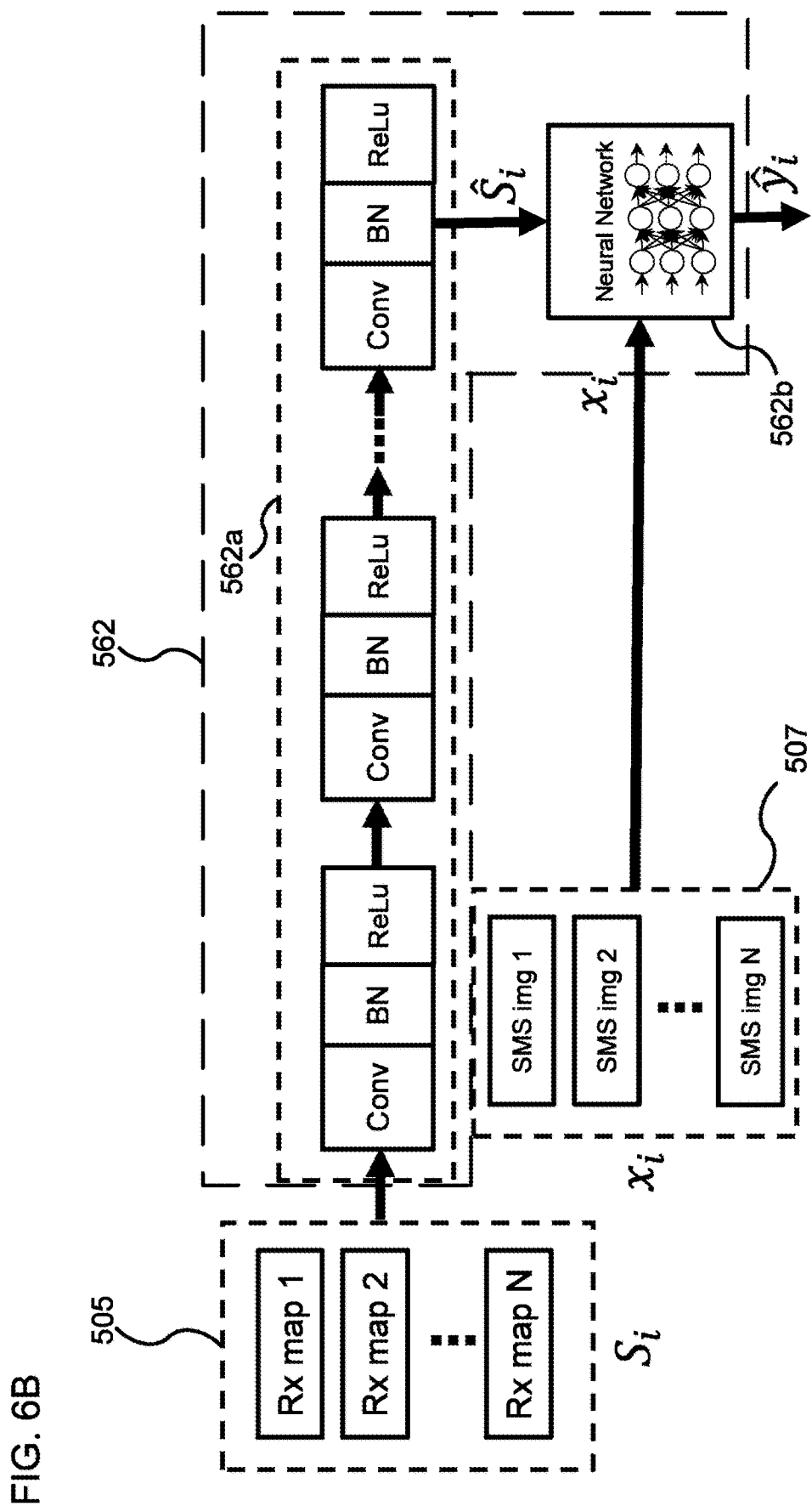
FIG. 6B shows a diagram for an example of data flow in an implementation of the flow diagram in FIG. 6A, according to one implementation.

FIGS. 6A and 6B show non-limiting examples of the method in which DL network 562 are used in performing SMS MRI image reconstruction. As shown in FIG. 6B, the DL network 562 include a first network 562a and a second network 562b. The first network 562a is similar to network 561, in that it corrects the coil sensitivity 505 $S_i$. The second network 562b performs the SENSE operation or its equivalent. For example, the SENSE operation can itself be learned using a fully-connected feedforward neural network. By using a neural network instead of SENSE, the gradients can be computed directly, and conventional backpropagation methods can be used in process 560 to train the DL network 562. One challenge of this implementation, is that the network has a larger number of weights to optimize, which can slow down the training process 560. An advantage of this method is that the first network 562a and the second network 562b are combined into a single network with two inputs (i.e., the coil sensitivity 505 $S_i$ and the SMS data 507 $y_i$), effectively combining steps 510 and 520 into a single step. That is, in the implementation shown in FIGS. 6A and 6B, process 560 can be slower, but process 502 can be faster. Because process 560 can be performed once and stored, whereas process 502 is repeated multiple times (e.g., once for each SMS-MRI scan), the slow down to process 560 can be more than offset by a speed up to process 502.

Figure 7A:
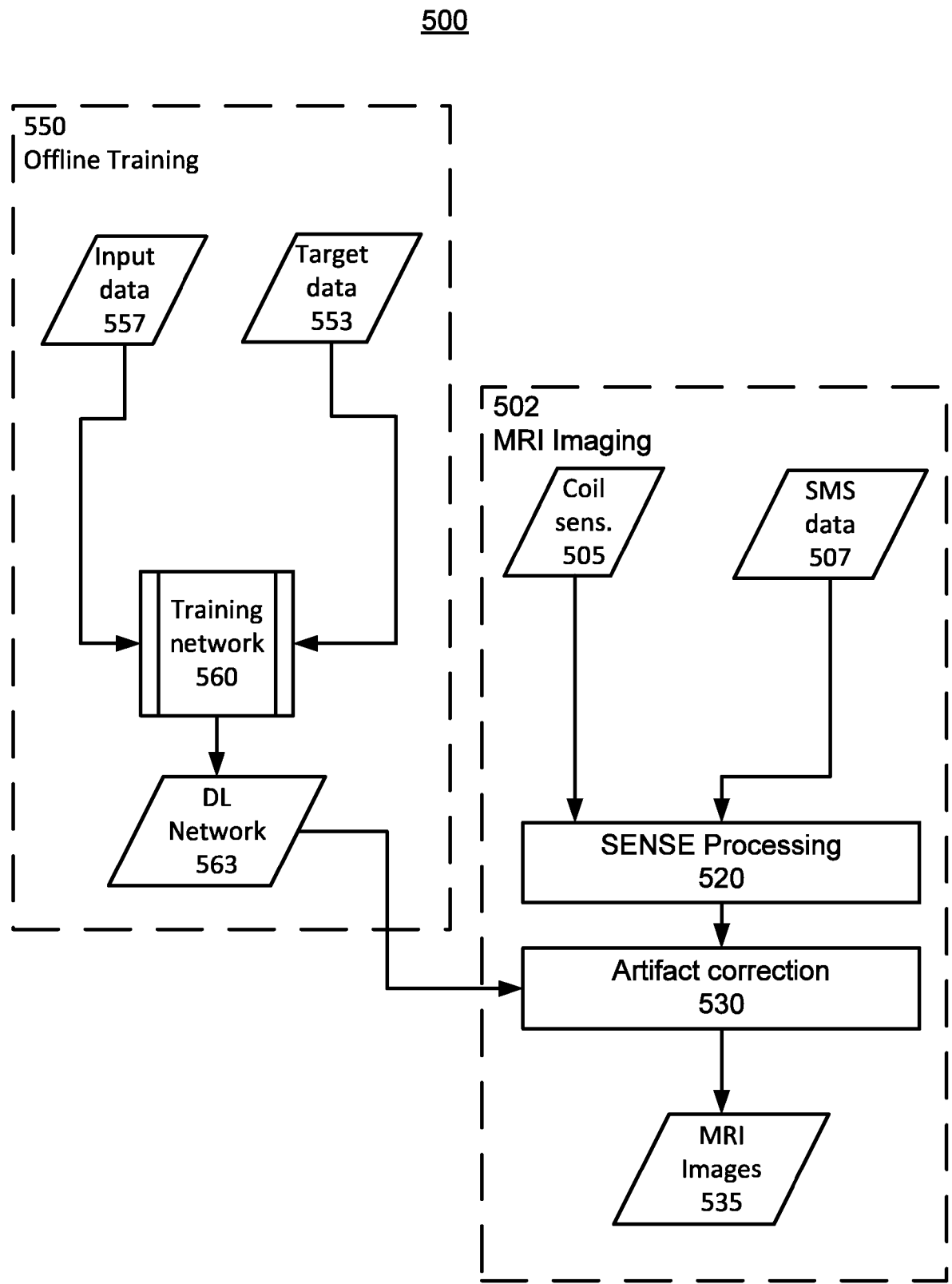
FIG. 7A shows an example of a flow diagram for training and using a DL-ANN to mitigate leakage/aliasing artifacts by detecting artifacts in unaliased images output from a SENSE operation and subtracting the detected artifacts from the unaliased images, according to one implementation.
Figure 7B:
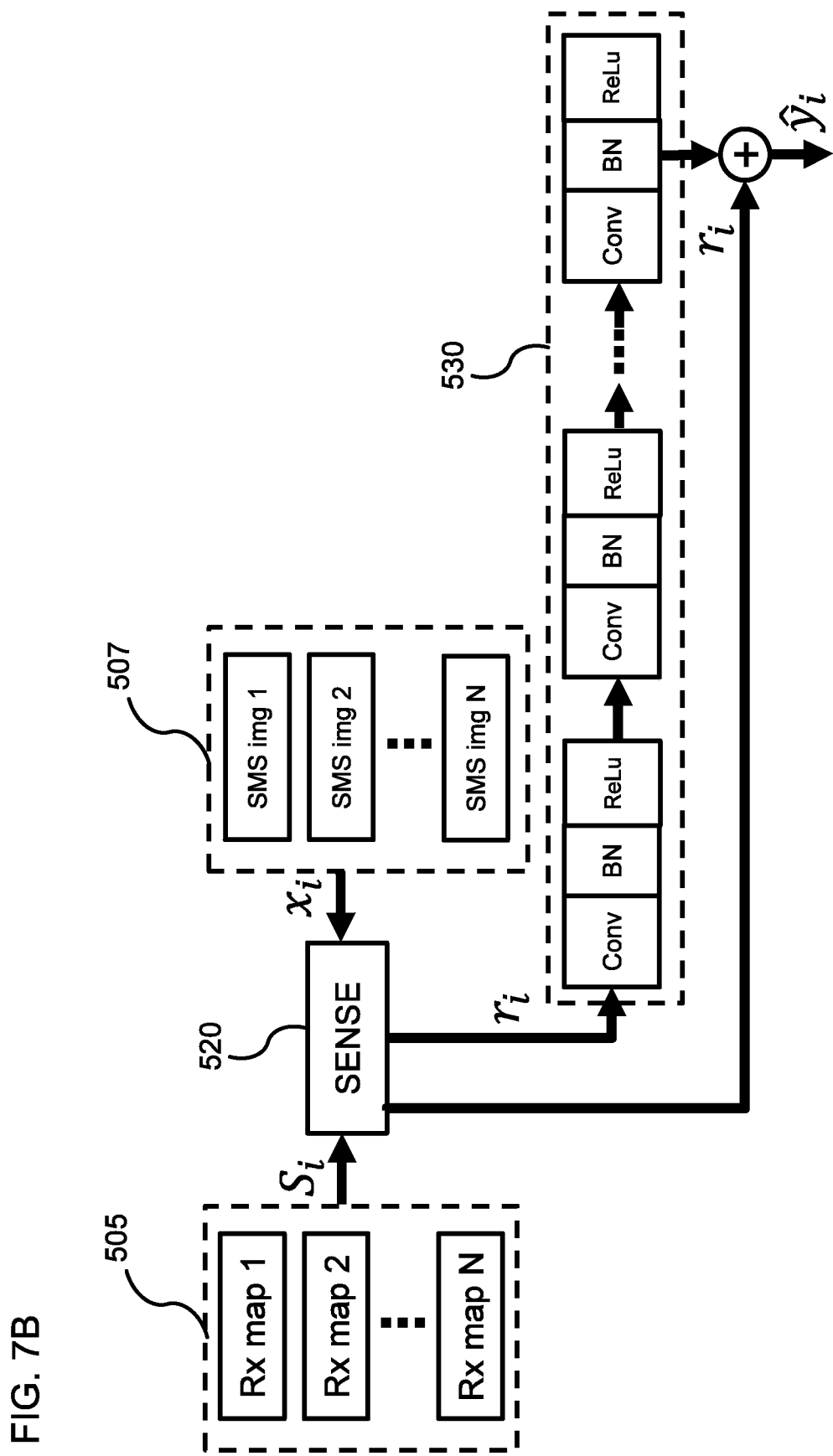
FIG. 7B shows a diagram for an example of data flow in an implementation of the flow diagram in FIG. 7A, according to one implementation.

FIGS. 7A and 7B show non-limiting examples of an implementation of method 500 in which a DL network 563 is used to correct artifacts in SMS MRI image reconstruction. The SENSE processing is performed at step 520 before artifact-exhibiting SMS slice images $r_i$ are applied to the neural network 563. The result in applying the artifact-exhibiting SMS slice images $r_i$ to the network 563 is to reduce/mitigate the (residual) artifacts in the SMS slice images $\hat{y}_i$ produced using the output from the network 563. In FIG. 7B, the network 563 is shown as a CNN. Further, the network 563 is shown to output the artifact images as a residue, and this residue is then subtracted from the artifact-exhibiting images $r_i$ to produce the artifact reduced SMS slice images 535 $\hat{y}_i$.

In the process 560 illustrated in FIG. 7A, the training of the network is performed to match how the network 563 is used in process 502. This is also true for the specific implementations of processes 560 and 502 illustrated in FIGS. 5A and 6A. That is, for each implementation, the processes 560 to train the network is specific to how the network is used in process 502 of that particular implementation. In FIG. 7B, the leakage artifact is treated as an additive spurious signal that is to be estimated using the network 563, and then rejected by subtracting (or otherwise removing) the spurious signal from the SMS slice images In contrast to the training of networks 561 and 562, for each pair in the training data used to train network 563, the input data 557 is a set of SMS slice images $r_i$. That is, different from the previous networks 561 and 562, each training pair i comprises input data 557 that is unaliased SMS images $r_i$ reconstructed using SENSE processing. The target data 553 can be the same as used for the previous networks 561 and 562 (i.e., single-slice images acquired without SMS $y_i$).

As shown in FIGS. 7A and 7B, network 563 can be a residual network (ResNet) in which slice-leakage is treated as a residue added on top of the image. The network 563 then learns to remove this residue and produce images that are free of slice leakage.

In certain implementations, network 563 can perform denoising in addition to performing artifact reduction. For example, denoising can be achieved by using, as the target data 553, high-NAQ (number of acquisitions) single-slice target images. By averaging over a large number of acquisitions, the noise in the target images averages out, and the network 563 can be trained to detect additive noise as a spurious signal that is also to be subtracted out, like the artifacts. Alternatively (or in addition), the target data 553 can be denoised using a denoising method in order to decrease the noise in the target data 553 relative to the noise in the input data.

Exemplary denoising methods include linear smoothing filters, anisotropic diffusion, non-local means, or nonlinear filters. Linear smoothing filters remove noise by convolving the original image with a mask that represents a low-pass filter or smoothing operation. For example, the Gaussian mask comprises elements determined by a Gaussian function. This convolution brings the value of each pixel into closer agreement with the values of its neighbors. Anisotropic diffusion removes noise while preserving sharp edges by evolving an image under a smoothing partial differential equation similar to the heat equation. A median filter is an example of a nonlinear filter and, if properly designed, a nonlinear filter can also preserve edges and avoid blurring. The median filter is one example of a rank-conditioned rank-selection (RCRS) filter, which can be applied to remove salt and pepper noise from an image without introducing significant blurring artifacts. Additionally, a filter using a total-variation (TV) minimization regularization term can be applied if imaged region supports an assumption of uniformity over large areas that are demarked by sharp boundaries between the uniform areas. A TV filter is another example of a nonlinear filter. Moreover, non-local means filtering is an exemplary method of determining denoised pixels using a weighted average over similar patches within the images.

Relative to networks 561 and 562, network 563 has several advantages. The network 563 does not require computation of loss function gradients through the SENSE reconstruction. This is because the SENSE operation is not part of the learning process (e.g., the unaliased SMS images $r_i$ applied to the network are after the SENSE operation performed in step 520). In view of the learning process being simpler, the learning process is also faster and less computationally burdensome. Additionally, network 563 incorporates less information than the previous network (e.g., network 563 does not incorporate information regarding the coil maps, and the input SENSE-reconstructed SMS images are coil-combined).

Now a more detailed description of training a DL-ANN network is provided (e.g., process 560). This description is illustrated using the non-limiting example illustrated in FIG. 7A in which the target data 553 is the single-slice images acquired without SMS $y_i$ and the input data 557 is the unaliased SMS images $r_i$. In general, however, any target data 553 and input data 557 can be used.

Figure 8:
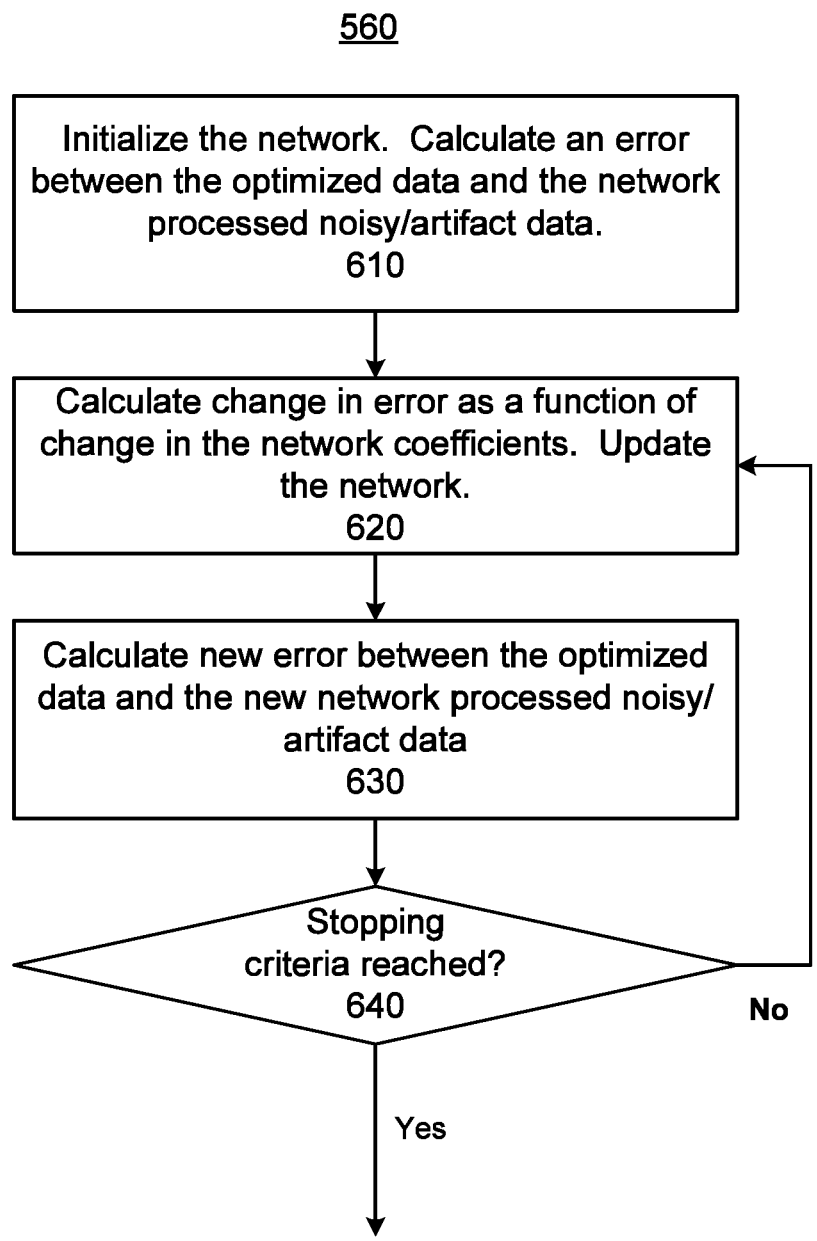
FIG. 8 shows a flow diagram of training a DL-ANN network by iteratively adjusting coefficients of the DL-ANN network to optimize a loss-error function, according to one implementation.

FIG. 8 shows a flow diagram of one implementation of the training process 560. In process 560, input data 557 and target data 553 are used as training data to train a DL-ANN network 563, resulting in the DL-ANN network 563 being output from step 640 of process 560. In general, the data 557 can be any defect-exhibiting images or images, for which the defect can be any undesirable characteristic that can be affected through image processing (e.g., noise or an artifact). Similarly, data 553 can be referred to as target data, defect-reduced data, defect-minimized data, or optimized data, for which the defect is less than in the images 557. The offline DL training process 560 trains the DL-ANN network 563 using a large number of input images 557 that are paired with corresponding target images 553 to train the DL-ANN network 563 to produce images resembling the target images 553 from the input images 557.

In process 560, a set of training data is obtained, and the network 563 is iteratively updated to reduce the error (e.g., the value produced by a loss function). The DL-ANN network infers the mapping implied by the training data, and the cost function produces an error value related to the mismatch between the target images 553 and the result produced by applying a current incarnation of the DL-ANN network 563 to the input images 557. For example, in certain implementations, the cost function can use the mean-squared error to minimize the average squared error. In the case of a multilayer perceptrons (MLP) neural network, the backpropagation algorithm can be used for training the network by minimizing the mean-squared-error-based cost function using a (stochastic) gradient descent method.

In step 610 of process 560, an initial guess is generated for the coefficients of the DL-ANN network 563. For example, the initial guess can be based on a priori knowledge of the region being imaged or one or more exemplary denoising methods, edge-detection methods, and/or blob detection methods. Additionally, the initial guess can be based on one of a LeCun initialization, an Xavier initialization, and a Kaiming initialization.

Steps 610 through 640 of process 560 provide a non-limiting example of an optimization method for training the DL-ANN network 563.

An error is calculated (e.g., using a loss function or a cost function) to represent a measure of the difference (e.g., a distance measure) between the target images 553 (i.e., ground truth) and input images 557 after applying a current version of the network 563. The error can be calculated using any known cost function or distance measure, including those cost functions described above. Further, in certain implementations the error/loss function can be calculated using one or more of a hinge loss and a cross-entropy loss.

Additionally, the loss function can be combined with a regularization approach to avoid overfitting the network to the particular instances represented in the training data. Regularization can help to prevent overfitting in machine learning problems. If trained too long, and assuming the model has enough representational power, the network will learn the artifacts specific to that dataset, which is referred to as overfitting. In case of overfitting, the DL-ANN becomes a poor generalization, and the variance will be large because the artifact varies between datasets. The minimum total error occurs when the sum of bias and variance are minimal. Accordingly, it is desirable to reach a local minimum that explains the data in the simplest possible way to maximize the likelihood that the trained network represents a general solution, rather than a solution particular to the artifact in the training data. This goal can be achieved, e.g., by early stopping, weight regularization, lasso regularization, ridge regularization, or elastic net regularization.

In certain implementations, the network 563 is trained using backpropagation. Backpropagation can be used for training neural networks and is used in conjunction with gradient descent optimization methods. During a forward pass, the algorithm computes the network's predictions based on the current parameters Θ. These predictions are then input into the loss function, by which they are compared to the corresponding ground truth labels (i.e., the target image 553). During the backward pass, the model computes the gradient of the loss function with respect to the current parameters, after which the parameters are updated by taking a step of a predefined size in the direction of minimized loss (e.g., in accelerated methods, such that the Nesterov momentum method and various adaptive methods, the step size can be selected to more quickly converge to optimize the loss function).

The optimization method by which the backprojection is performed can use one or more of gradient descent, batch gradient descent, stochastic gradient descent, and mini-batch stochastic gradient descent. Additionally, the optimization method can be accelerated using one or more momentum update techniques in the optimization approach that results in faster convergence rates of stochastic gradient descent in deep networks, including, e.g, Nesterov momentum technique or an adaptive method, such as Adagrad sub-gradient method, an Adadelta or RMSProp parameter update variation of the Adagrad method, and an Adam adaptive optimization technique. The optimization method can also apply a second order method by incorporating the Jacobin matrix into the update step.

The forward and backwards passes can be performed incrementally through the respective layers of the network. In the forward pass, the execution starts by feeding the inputs through the first layer, thus creating the output activations for the subsequent layer. This process is repeated until the loss function at the last layer is reached. During the backward pass, the last layer computes the gradients with respect to its own learnable parameters (if any) and also with respect to its own input, which serves as the upstream derivatives for the previous layer. This process is repeated until the input layer is reached.

Returning to FIG. 8, step 620 of process 560 determines a change in the error as a function of the change in the network can be calculated (e.g., an error gradient), and this change in the error can be used to select a direction and step size for a subsequent change to the weights/coefficients of the DL-ANN network 563. Calculating the gradient of the error in this manner is consistent with certain implementations of a gradient descent optimization method. In certain other implementations, this step can be omitted and/or substituted with another step in accordance with another optimization algorithm (e.g., a non-gradient descent optimization algorithm like simulated annealing or a genetic algorithm), as would be understood by one of ordinary skill in the art.

In step 620 of process 560, a new set of coefficients are determined for the DL-ANN network 563. For example, the weights/coefficients can be updated using the change calculated in step 620, as in a gradient descent optimization method or an over-relaxation acceleration method.

In step 630 of process 560, a new error value is calculated using the updated weights/coefficients of the DL-ANN network 563.

In step 640, predefined stopping criteria are used to determine whether the training of the network is complete. For example, the predefined stopping criteria can evaluate whether the new error and/or the total number of iterations performed exceed predefined values. For example, the stopping criteria can be satisfied if either the new error falls below a predefined threshold or if a maximum number of iterations is reached. When the stopping criteria is not satisfied the training process performed in process 560 will continue back to the start of the iterative loop by returning and repeating step 620 using the new weights and coefficients (the iterative loop includes steps 620, 630, and 640). When the stopping criteria are satisfied the training process performed in process 560 is completed.

Figure 9A:
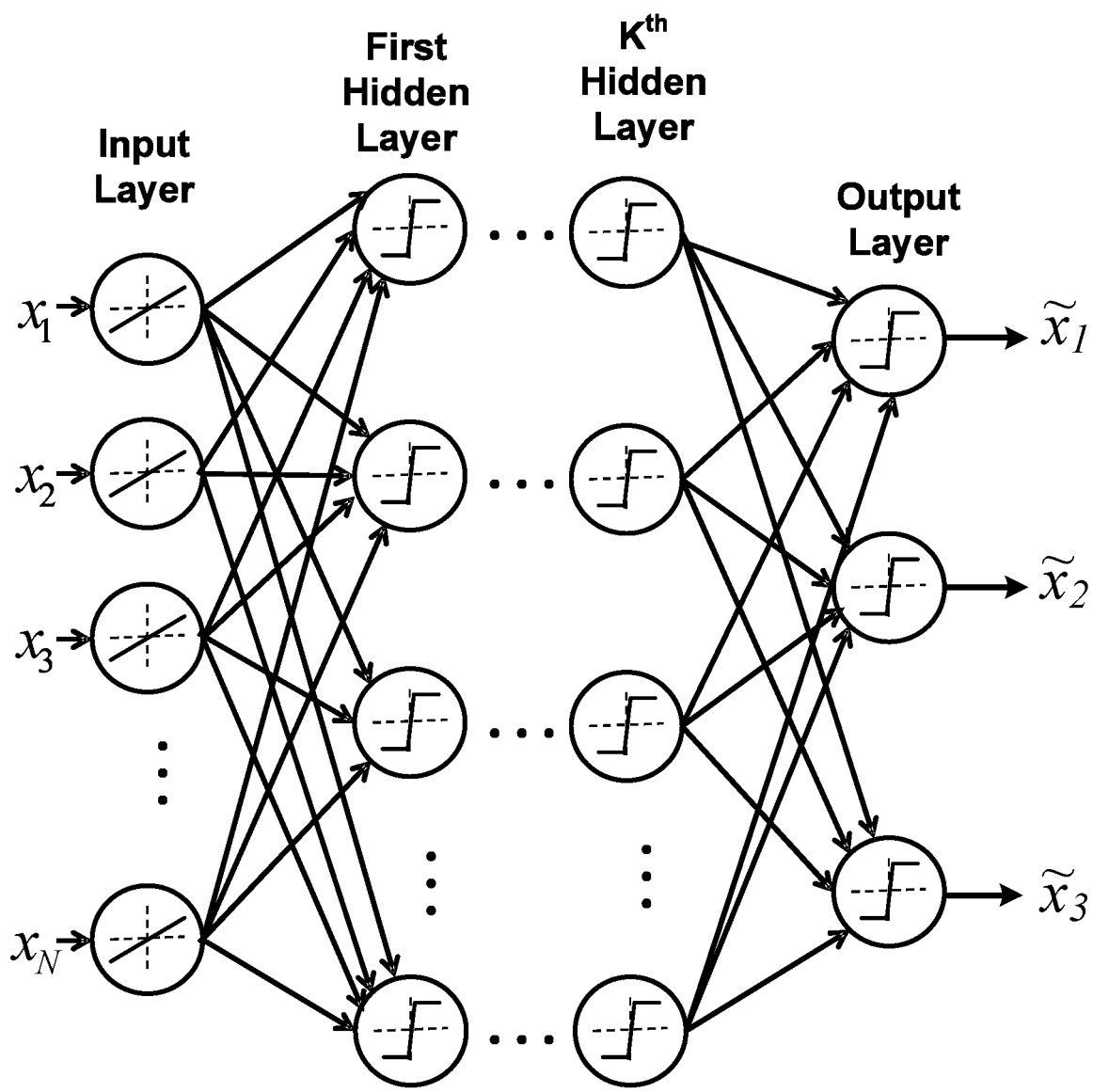
FIG. 9A shows an example of a feedforward ANN, according to one implementation.
Figure 9B:
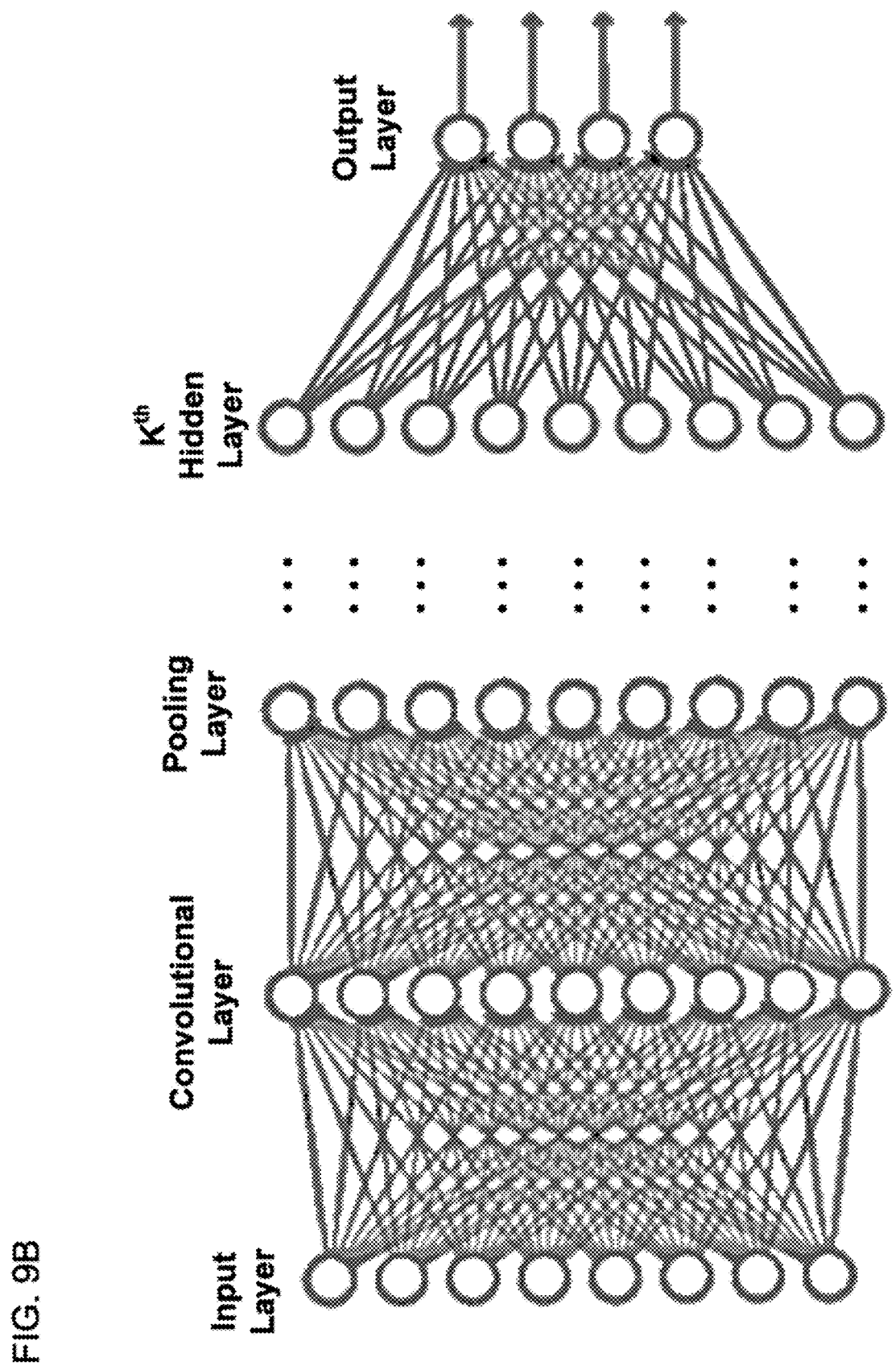
FIG. 9B shows an example of a type of ANN referred to as a convolutional neural network (CNN), according to one implementation.

FIGS. 9A and 9B show various examples of the interconnections between layers in the DL-ANN network 563. The DL-ANN network 563 can include fully connected, convolutional, and the pooling layer, all of which are explained below. In certain preferred implementations of the DL-ANN network 563, convolutional layers are placed close to the input layer, whereas fully connected layers, which perform the high-level reasoning, are place further down the architecture towards the loss function. Pooling layers can be inserted after convolutions and provide a reduction lowering the spatial extent of the filters, and thus the amount of learnable parameters. Activation functions are also incorporated into various layers to introduce nonlinearity and enable the network to learn complex predictive relationships. The activation function can be a saturating activation functions (e.g., a sigmoid or hyperbolic tangent activation function) or rectified activation function (e.g., the Rectified Linear Unit (ReLU) applied in the first and second examples discussed above). The layers of the DL-ANN network 563 can also incorporate batch normalization, as also exemplified in the first and second examples discussed above.

FIG. 9A shows an example of a general artificial neural network (ANN) having N inputs, K hidden layers, and three outputs. For example, the ANN in FIG. 9A can be a fully connected network. Each layer is made up of nodes (also called neurons), and each node performs a weighted sum of the inputs and compares the result of the weighted sum to a threshold to generate an output. ANNs make up a class of functions for which the members of the class are obtained by varying thresholds, connection weights, or specifics of the architecture such as the number of nodes and/or their connectivity. The nodes in an ANN can be referred to as neurons (or as neuronal nodes), and the neurons can have inter-connections between the different layers of the ANN system. The simplest ANN has three layers, and is called an autoencoder. The DL-ANN network 563 can have more than three layers of neurons, and can have as many outputs neurons $\tilde{x}_N$ as input neurons, wherein N is the number of pixels in the reconstructed image. The synapses (i.e., the connections between neurons) store values called "weights" (also interchangeably referred to as "coefficients" or "weighting coefficients") that manipulate the data in the calculations. The outputs of the ANN depend on three types of parameters: (i) the interconnection pattern between the different layers of neurons, (ii) the learning process for updating the weights of the interconnections, and (iii) the activation function that converts a neuron's weighted input to its output activation.

Mathematically, a neuron's network function m(x) is defined as a composition of other functions $n_i(x)$, which can further be defined as a composition of other functions. This can be conveniently represented as a network structure, with arrows depicting the dependencies between variables, as shown in FIG. 9A. For example, the ANN can use a nonlinear weighted sum, wherein $m(x)=K(\Sigma_i w_i n_i(x))$, where K (commonly referred to as the activation function) is some predefined function, such as the hyperbolic tangent.

In FIG. 9A, the neurons (i.e., nodes) are depicted by circles around a threshold function. For the non-limiting example shown in FIG. 9A, the inputs are depicted as circles around a linear function, and the arrows indicate directed connections between neurons. In certain implementations, the DL-ANN network 563 is a feedforward network.

FIG. 9B shows a non-limiting example in which the DL-ANN network 563 is a convolutional neural network (CNN). CNNs are type of ANN that has beneficial properties for image processing, and, therefore, have special relevancy for the applications of image denoising. CNNs use feedforward ANNs in which the connectivity pattern between neurons can represent convolutions in image processing. For example, CNNs can be used for image-processing optimization by using multiple layers of small neuron collections which process portions of the input image, called receptive fields. The outputs of these collections can then tiled so that they overlap, to obtain a better representation of the original image. This processing pattern can be repeated over multiple layers having alternating convolution and pooling layers.

Following after a convolutional layer, a CNN can include local and/or global pooling layers, which combine the outputs of neuron clusters in the convolution layers. Additionally, in certain implementations, the CNN can also include various combinations of convolutional and fully connected layers, with pointwise nonlinearity applied at the end of or after each layer.

CNNs have several advantages for image processing. To reduce the number of free parameters and improve generalization, a convolution operation on small regions of input is introduced. One significant advantage of certain implementations of CNNs is the use of shared weight in convolutional layers, which means that the same filter (weights bank) is used as the coefficients for each pixel in the layer; this both reduces memory footprint and improves performance. Compared to other image-processing methods, CNNs advantageously use relatively little pre-processing. This means that the network is responsible for learning the filters that in traditional algorithms were hand-engineered. The lack of dependence on prior knowledge and human effort in designing features is a major advantage for CNNs.

Figure 10:
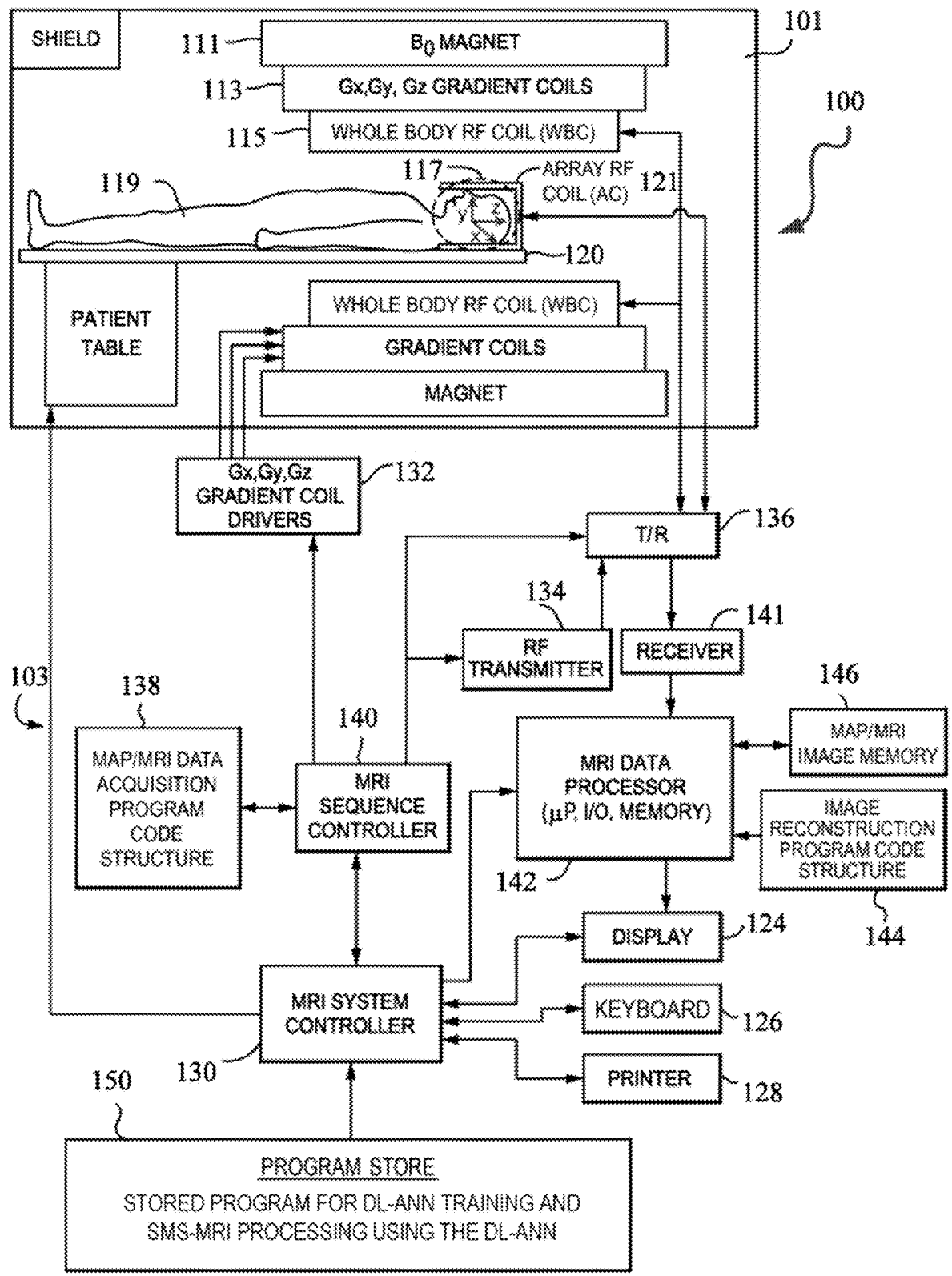
FIG. 10 shows a first example of magnetic resonance imaging (MRI) system, according to one implementation.

FIG. 10 shows a non-limiting example of a magnetic resonance imaging (MRI) system 100. The MRI system 100 depicted in FIG. 10 includes a gantry 101 (shown in a schematic cross-section) and various related system components 103 interfaced therewith. At least the gantry 101 is typically located in a shielded room. The MRI system geometry depicted in FIG. 10 includes a substantially coaxial cylindrical arrangement of the static field $B_0$ magnet 111, a Gx, Gy, and Gz gradient coil set 113, and a large whole-body RF coil (WBC) assembly 115. Along a horizontal axis of this cylindrical array of elements is an imaging volume 117 shown as substantially encompassing the head of a patient 119 supported by a patient table 120.

One or more smaller array RF coils 121 can be more closely coupled to the patient's head (referred to herein, for example, as "scanned object" or "object") in imaging volume 117. As those in the art will appreciate, compared to the WBC (whole-body coil), relatively small coils and/or arrays, such as surface coils or the like, are often customized for particular body parts (e.g., arms, shoulders, elbows, wrists, knees, legs, chest, spine, etc.). Such smaller RF coils are referred to herein as array coils (AC) or phased-array coils (PAC). These can include at least one coil configured to transmit RF signals into the imaging volume, and a plurality of receiver coils configured to receive RF signals from an object, such as the patient's head, in the imaging volume.

The MRI system 100 includes a MRI system controller 130 that has input/output ports connected to a display 124, a keyboard 126, and a printer 128. As will be appreciated, the display 124 can be of the touch-screen variety so that it provides control inputs as well. A mouse or other I/O device(s) can also be provided.

The MRI system controller 130 interfaces with a MRI sequence controller 140, which, in turn, controls the Gx, Gy, and Gz gradient coil drivers 132, as well as the RF transmitter 134, and the transmit/receive switch 136 (if the same RF coil is used for both transmission and reception). The MRI sequence controller 140 includes suitable program code structure 138 for implementing MRI imaging (also known as nuclear magnetic resonance, or NMR, imaging) techniques including parallel imaging. MRI sequence controller 140 can be configured for MR imaging with or without parallel imaging. Moreover, the MRI sequence controller 140 can facilitate one or more preparation scan (pre-scan) sequences, and a scan sequence to obtain a main scan magnetic resonance (MR) image (referred to as a diagnostic image). MR data from pre-scans can be used, for example, to determine sensitivity maps for RF coils 115 and/or 121 (sometimes referred to as coil sensitivity maps or spatial sensitivity maps), and to determine unfolding maps for parallel imaging.

The MRI system components 103 include an RF receiver 141 providing input to data processor 142 so as to create processed image data, which is sent to display 124. The MRI data processor 142 is also configured to access previously generated MR data, images, and/or maps, such as, for example, coil sensitivity maps, parallel image unfolding maps, distortion maps and/or system configuration parameters 146, and MRI image reconstruction program code structures 144 and 150.

In one embodiment, the MRI data processor 142 includes processing circuitry. The processing circuitry can include devices such as an application-specific integrated circuit (ASIC), configurable logic devices (e.g., simple programmable logic devices (SPLDs), complex programmable logic devices (CPLDs), and field programmable gate arrays (FPGAs), and other circuit components that are arranged to perform the functions recited in the present disclosure.

The processor 142 executes one or more sequences of one or more instructions contained in the program code structures 144 and 150. Alternatively, the instructions can be read from another computer-readable medium, such as a hard disk or a removable media drive. One or more processors in a multi-processing arrangement can also be employed to execute the sequences of instructions contained in the program code structures 144 and 150. In alternative embodiments, hard-wired circuitry can be used in place of or in combination with software instructions. Thus, the disclosed embodiments are not limited to any specific combination of hardware circuitry and software.

Additionally, the term "computer-readable medium" as used herein refers to any non-transitory medium that participates in providing instructions to the processor 142 for execution. A computer readable medium can take many forms, including, but not limited to, non-volatile media or volatile media. Non-volatile media includes, for example, optical, magnetic disks, and magneto-optical disks, or a removable media drive. Volatile media includes dynamic memory.

Also illustrated in FIG. 10 is a generalized depiction of an MRI system program storage (memory) 150, where stored program code structures are stored in non-transitory computer-readable storage media accessible to the various data processing components of the MRI system 100. As those in the art will appreciate, the program store 150 can be segmented and directly connected, at least in part, to different ones of the system 103 processing computers having most immediate need for such stored program code structures in their normal operation (i.e., rather than being commonly stored and connected directly to the MRI system controller 130).

Additionally, the MRI system 100 as depicted in FIG. 10 can be utilized to practice exemplary embodiments described herein below. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Furthermore, not only does the physical state of the processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an image reconstruction process and/or sometimes an image reconstruction map (e.g., coil sensitivity map, unfolding map, ghosting map, a distortion map etc.) generation process, an array of computer-readable accessible data value storage sites in physical storage media will be transformed from some prior state to a new state wherein the physical states at the physical sites of such an array vary between minimum and maximum values to represent real world physical events and conditions. As those in the art will appreciate, such arrays of stored data values represent and also constitute a physical structure, as does a particular structure of computer control program codes that, when sequentially loaded into instruction registers and executed by one or more CPUs of the MRI system 100, causes a particular sequence of operational states to occur and be transitioned through within the MRI system 100.

While certain implementations have been described, these implementations have been presented by way of example only, and are not intended to limit the teachings of this disclosure. Indeed, the novel methods, apparatuses and systems described herein may be embodied in a variety of other forms; furthermore, various omissions, substitutions and changes in the form of the methods, apparatuses and systems described herein may be made without departing from the spirit of this disclosure.

The invention claimed is:

1. An apparatus, comprising:
  processing circuitry configured to
    obtain simultaneous multi-slice (SMS) magnetic resonance imaging (MRI) data representing radio frequency (RF) signals that are received at a plurality of receive coils,
    obtain receive-coil (Rx) sensitivities corresponding to the plurality of receive coils,
    perform a sensitivity encoding (SENSE) operation based on the SMS-MRI data and the Rx sensitives to generate unaliased SMS images from aliased SMS images of the SMS-MRI data, and
    obtain a neural network that is trained such that, when the neural network is used together with the SENSE operation to generate the unaliased SMS images, artifacts in the unaliased SMS images are mitigated compared to unaliased SMS images that would be generated using a SENSE operation without the neural network, wherein,
  the processing circuitry is further configured to perform the SENSE operation on the aliased SMS images by,
  applying the Rx sensitivities to the neural network as the input to the neural network, and generating corrected Rx sensitivities as the output from the neural network, and
  applying the corrected Rx sensitivities to the SENSE operation as an input to the SENSE operation together with the aliased SMS images as another input to the SENSE operation, and generating unaliased SMS images as the output from the SENSE operation.

2. The apparatus according to claim 1, wherein the processing circuitry is further configured to train the neural network using a modified backpropagation method in which a gradient of a loss function is calculated through the SENSE operation.

3. The apparatus according to claim 1, wherein the processing circuitry is further configured to
train the neural network using training data and a loss function that represents, as an error value, a disagreement between pairs of the training data, each pair of the training data including input data and target data, the target data being images in which an artifact is mitigated, the input data being training unaliased SMS images in which the artifact is not mitigated or being training aliased SMS images which when applied to the SENSE operation without the neural network produce the training unaliased SMS images in which the artifact is not mitigated, wherein the neural network is trained by performing, for each of the pairs, steps of
applying the neural network to input data of a pair to generate network processed data,
calculating, using the loss function, the error value between the network processed data and the target data of the pair,
updating, based on the calculated error value, weighting coefficients of the neural network, and
repeating the steps of applying, calculating, and updating using respective pairs of the training data until one or more stopping criteria are satisfied.

4. The apparatus according to claim 1, further comprising:
the plurality of receive coils,
a first magnet configured to generate a uniform magnetic field,
gradient magnets configured to generate gradient magnetic fields, and
an RF transmitter configured to transmit a SMS-MRI pulse sequence.

5. An apparatus, comprising:
processing circuitry configured to
obtain simultaneous multi-slice (SMS) magnetic resonance imaging (MRI) data representing radio frequency (RF) signals that are received at a plurality of receive coils,
obtain receive-coil (Rx) sensitivities corresponding to the plurality of receive coils,
perform a sensitivity encoding (SENSE) operation based on the SMS-MRI data and the Rx sensitives to generate unaliased SMS images from aliased SMS images of the SMS-MRI data, and
obtain a neural network that is trained such that, when the neural network is used together with the SENSE operation to generate the unaliased SMS images, artifacts in the unaliased SMS images are mitigated compared to unaliased SMS images that would be generated using a SENSE operation without the neural network, wherein,
when performing the SENSE operation, an input including the Rx sensitivities is applied to the neural network, and an output from the neural network is used to generate the unaliased SMS images, and
wherein the performing the SENSE operation together with the neural network reduces leakage artifacts in which a portion of pixels values from one slice leaks into pixel values of an unaliased SMS image of another slice of the SMS-MRI data.

6. An apparatus, comprising:
processing circuitry configured to
obtain simultaneous multi-slice (SMS) magnetic resonance imaging (MRI) data representing radio frequency (RF) signals that are received at a plurality of receive coils,
obtain receive-coil (Rx) sensitivities corresponding to the plurality of receive coils,
perform a sensitivity encoding (SENSE) operation based on the SMS-MRI data and the Rx sensitives to generate unaliased SMS images from aliased SMS images of the SMS-MRI data, and
obtain a neural network that is trained such that, when the neural network is used together with the SENSE operation to generate the unaliased SMS images, artifacts in the unaliased SMS images are mitigated compared to unaliased SMS images that would be generated using a SENSE operation without the neural network, wherein,
when performing the SENSE operation, an input including the Rx sensitivities is applied to the neural network, and an output from the neural network is used to generate the unaliased SMS images, and
wherein the neural network includes a first part that is a convolutional neural network (CNN) and a second part that is another neural network, and
the processing circuitry is further configured to perform the SENSE operation on the aliased SMS images by
applying the Rx sensitivities to the CNN as an input to the CNN, and generating corrected Rx sensitivities as an output from the CNN, and
applying the aliased SMS images to the another neural network as an input to the another neural network, the another neural network using the corrected Rx sensitivities to perform the SENSE operation to the aliased SMS images and generating the unaliased SMS images as an output from the another neural network.

7. The apparatus according to claim 6, wherein the processing circuitry is further configured to train the neural network using a backpropagation method.

8. An apparatus, comprising:
processing circuitry configured to
obtain simultaneous multi-slice (SMS) magnetic resonance imaging (MRI) data representing radio frequency (RF) signals that are received at a plurality of receive coils,
obtain receive-coil (Rx) sensitivities corresponding to the plurality of receive coils,
perform a sensitivity encoding (SENSE) operation based on the SMS-MRI data and the Rx sensitives to generate unaliased SMS images from aliased SMS images of the SMS-MRI data, and
obtain a neural network that is trained such that, when the neural network is used together with the SENSE operation to generate the unaliased SMS images, artifacts in the unaliased SMS images are mitigated compared to unaliased SMS images that would be generated using a SENSE operation without the neural network, wherein,
when performing the SENSE operation, an input including the Rx sensitivities is applied to the neural network, and an output from the neural network is used to generate the unaliased SMS images, and
wherein the processing circuitry is further configured to obtain another neural network that receives as an input first unaliased SMS images and generates as an out second unaliased SMS images, wherein the another neural network is trained to reduce artifacts in the second unaliased SMS images relative to the artifacts in the first unaliased SMS images, and apply the unaliased SMS images, which as generated by performing the SENSE operation, to the another neural network to generate corrected unaliased SMS images, which have reduced artifacts compared to the unaliased SMS images.

9. The apparatus according to claim 8, wherein the processing circuitry is further configured to train the another neural network using training data and a loss function that represents, as an error value, a disagreement between pairs of the training data, each pair of the training data including input data and target data, the target data being artifact-mitigated unaliased SMS images in which an artifact is mitigated, the input data being artifact-exhibiting unaliased SMS images in which the artifact is not mitigated, wherein the another neural network is trained by performing, for each of the pairs, steps of applying the another neural network to input data of a pair to generate network processed data, calculating, using the loss function, the error value between the network processed data and the target data of the pair, updating, based on the calculated error value, weighting coefficients of the another neural network, and repeating the steps of applying, calculating, and updating using respective pairs of the training data until one or more stopping criteria are satisfied.

10. The apparatus according to claim 9, wherein the processing circuitry is further configured to train the neural network, wherein the target data is denoised relative to the input data, and applying the unaliased SMS images to the neural network generates the corrected unaliased SMS images, wherein the corrected unaliased SMS images are denoised relative to the unaliased SMS images.

11. A method, comprising:

obtaining simultaneous multi-slice (SMS) magnetic resonance imaging (MRI) data representing radio frequency (RF) signals that are received at a plurality of receive coils, obtaining receive-coil (Rx) sensitivities corresponding to the plurality of receive coils, performing a sensitivity encoding (SENSE) operation based on the SMS-MRI data and the Rx sensitives to generate unaliased SMS images from aliased SMS images of the SMS-MRI data, and obtaining a neural network that is trained such that, when the neural network is used together with the SENSE operation to generate the unaliased SMS images, artifacts in the unaliased SMS images are mitigated compared to unaliased SMS images that would be generated using a SENSE operation without the neural network, wherein the performing the SENSE operation further includes applying the Rx sensitivities to the neural network as the input to the neural network, and generating corrected Rx sensitivities as the output from the neural network, and applying the corrected Rx sensitivities to the SENSE operation as an input to the SENSE operation together with the aliased SMS images as another input to the SENSE operation, and generating unaliased SMS images as the output from the SENSE operation.

12. The method according to claim 11, wherein the performing the SENSE operation together with the neural network reduces the artifacts, wherein the artifacts are leakage artifacts in which a portion of pixels values from one slice leaks into pixel values of an unaliased SMS images of another slice of the SMS-MRI data.

13. The method according to claim 11, further comprising training the neural network using a modified backpropagation method in which a gradient of a loss function is calculated through the SENSE operation.

14. The method according to claim 11, wherein the neural network includes a first part that is a convolutional neural network (CNN) and second part that is another neural network, and the performing the SENSE operation further includes applying the Rx sensitivities to the CNN as an input to the CNN, and generating corrected Rx sensitivities as an output from the CNN, and applying the aliased SMS images to the another neural network as an input to the another neural network, the another neural network using the corrected Rx sensitivities to perform the SENSE operation to the aliased SMS images and generating the unaliased SMS images as an output from the another neural network.

15. The method according to claim 14, further comprising training the neural network using a backpropagation method.

16. The method according to claim 11, further comprising training the neural network using training data and a loss function that represents, as an error value, a disagreement between pairs of the training data, each pair of the training data including input data and target data, the target data being images in which an artifact is mitigated, the input data being training unaliased SMS images in which the artifact is not mitigated or being training aliased SMS images which when applied to the SENSE operation without the neural network produce the training unaliased SMS images in which the artifact is not mitigated, wherein the neural network is trained by performing, for each of the pairs, steps of applying the neural network to input data of a pair to generate network processed data, calculating, using the loss function, the error value between the network processed data and the target data of the pair, updating, based on the calculated error value, weighting coefficients of the neural network, and repeating the steps of applying, calculating, and updating using respective pairs of the training data until one or more stopping criteria are satisfied.

17. A non-transitory computer readable storage medium including executable instructions, wherein the instructions, when executed by circuitry, cause the circuitry to perform the method according to claim 11.

18. A method, comprising:

obtaining simultaneous multi-slice (SMS) magnetic resonance imaging (MRI) data representing radio frequency (RF) signals that are received at a plurality of receive coils, obtaining receive-coil (Rx) sensitivities corresponding to the plurality of receive coils, performing a sensitivity encoding (SENSE) operation based on the SMS-MRI data and the Rx sensitives to generate unaliased SMS images from aliased SMS images of the SMS-MRI data, and obtaining a neural network that is trained such that, when the neural network is used together with the SENSE operation to generate the unaliased SMS images, artifacts in the unaliased SMS images are mitigated compared to unaliased SMS images that would be generated using a SENSE operation without the neural network, wherein when performing the SENSE operation, an input including the Rx sensitivities is applied to the neural network, and an output from the neural network is used to generate the unaliased SMS images, the method further comprising:

obtaining another neural network that receives as an input first unaliased SMS images and generates as an output second unaliased SMS images, wherein the another neural network is trained to reduce artifacts in the second unaliased SMS images relative to the artifacts in the first unaliased SMS images, and applying the unaliased SMS images, which as generated by performing the SENSE operation, to the another neural network to generate corrected unaliased SMS images, which have reduced artifacts compared to the unaliased SMS images.

\* \* \* \* \*